(12) United States Patent
Sasaki

(10) Patent No.: US 9,647,000 B2
(45) Date of Patent: May 9, 2017

(54) DISPLAY DEVICE

(71) Applicant: Japan Display Inc., Tokyo (JP)

(72) Inventor: Toshinari Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/012,306

(22) Filed: Feb. 1, 2016

(65) Prior Publication Data

US 2016/0233251 A1 Aug. 11, 2016

(30) Foreign Application Priority Data

Feb. 9, 2015 (JP) .................................. 2015-023018

(51) Int. Cl.
| | |
|---|---|
| *H01L 27/12* | (2006.01) |
| *H01L 27/32* | (2006.01) |
| *H01L 29/417* | (2006.01) |
| *H01L 29/786* | (2006.01) |
| *H01L 29/423* | (2006.01) |

(52) U.S. Cl.
CPC ........ *H01L 27/1225* (2013.01); *H01L 27/124* (2013.01); *H01L 27/326* (2013.01); *H01L 27/3246* (2013.01); *H01L 27/3251* (2013.01); *H01L 27/3262* (2013.01); *H01L 29/41733* (2013.01); *H01L 29/42384* (2013.01); *H01L 29/7869* (2013.01); *H01L 29/78609* (2013.01); *H01L 29/78696* (2013.01)

(58) Field of Classification Search
CPC ............... H01L 27/1225; H01L 27/124; H01L 27/3246; H01L 27/3251; H01L 27/3258; H01L 27/326; H01L 27/3262; H01L 29/41733; H01L 29/42384; H01L 29/78696; H01L 29/7869
See application file for complete search history.

(56) References Cited

U.S. PATENT DOCUMENTS

| | | | |
|---|---|---|---|
| 2011/0210327 A1 | 9/2011 | Kondo et al. | |
| 2015/0243687 A1* | 8/2015 | Lee .................... | H01L 29/7869 257/43 |

FOREIGN PATENT DOCUMENTS

JP 2014-194579 A 10/2014

* cited by examiner

*Primary Examiner* — Thanhha Pham
(74) *Attorney, Agent, or Firm* — Typha IP LLC

(57) ABSTRACT

A display device includes a first electrode, a first insulating layer having a first top surface and a first side wall, the first side wall having a closed shape and being exposed to a first opening reaching the first electrode, an oxide semiconductor layer on the first side wall, the oxide semiconductor layer including a first portion and a second portion, the first portion being connected with the first electrode, a gate electrode facing the oxide semiconductor layer, a gate insulating layer between the oxide semiconductor layer and the gate electrode, a first transparent conductive layer above the first top surface, the first transparent conductive layer being connected with the second portion, and a second transparent conductive layer connected with the first transparent conductive layer, the second transparent conductive layer forming the same layer with the first transparent conductive layer.

8 Claims, 24 Drawing Sheets

DISPLAY DEVICE

CROSS REFERENCE TO RELATED APPLICATIONS

This application is based upon and claims the benefit of priority from the prior Japanese Patent Application No. 2015-023018 filed on Feb. 9, 2015, the entire contents of which are incorporated herein by reference.

FIELD

The present invention relates to a display device, and an embodiment disclosed herein relates to a structure and a layout of transistors and pixels included in the display device.

BACKGROUND

Recently, a driving circuit of a display device, a personal computer or the like includes a semiconductor device such as a transistor, a diode or the like as a microscopic switching element. Especially in a display device, a transistor is used as a selective transistor that supplies a voltage or a current (data signal) in accordance with the gray scale of each of pixels that determine a video to be displayed, and also is used in a driving circuit that selects a pixel to which a data signal is to be supplied. The characteristics required of a transistor usable for a display device vary in accordance with the use thereof. For example, a transistor used as a selective transistor is required to have a low off-current or little variance from another transistor. A transistor used in a driving circuit is required to have a high on-current.

To be used in a display device as described above, a transistor including a channel formed of amorphous silicon, low-temperature polysilicon or single crystalline silicon has been conventionally developed. A display device using amorphous silicon or low-temperature polysilicon can be formed in a process of 600° C. or lower, and therefore can be formed by use of a glass substrate. Especially, a transistor using amorphous silicon in a display device can be formed with a simpler structure in a process of 400° C. or lower, and therefore can be formed by use of, for example, a large glass substrate referred to as an eighth-generation glass substrate (2160×2460 mm). However, such a transistor including a channel formed of amorphous silicon has a low mobility and is not usable in a driving circuit.

A transistor including a channel formed of low-temperature polysilicon or single crystalline silicon has a higher mobility than the semiconductor device including a channel formed of amorphous silicon, and therefore is usable as a selective transistor and also as a transistor in a driving circuit. However, such a transistor including a channel formed of low-temperature polysilicon or single crystalline silicon has a complicated structure and needs a complicated process to be manufactured. In addition, such a transistor needs to be formed in a process of 500° C. or higher, and therefore cannot be formed by use of a large glass substrate as described above. A transistor including a channel formed of amorphous silicon, low-temperature polysilicon or single crystalline silicon has a high off-current. In the case where such a transistor is used as a selective transistor, it is difficult to keep the applied voltage for a long time.

Recently, display devices have progressively become of higher resolution, and display devices of a resolution referred to as "4K", with which the number of pixels in the row direction is 4096 and the number of pixels in the column direction is 2160, have been developed. In addition, in order to display a moving picture more smoothly, a driving method of displaying 120 or 240 frames per second, instead of 60 frames according to the conventional art, has been developed. Along with the development of such technologies, the time used to supply a data signal corresponding to the gray scale of one pixel has been shortened as compared with by the conventional art. Therefore, in order to supply a data signal to pixels in a shorter time stably, it is desired to increase the mobility of a selective transistor included in the pixel.

For the above-described reasons, a display device including a transistor that includes a channel formed of an oxide semiconductor, instead of amorphous silicon, low-temperature polysilicon or single crystalline silicon, has been progressively developed recently (e.g., Japanese Laid-Open Patent Publication No. 2014-194579). A transistor including a channel formed of an oxide semiconductor can be formed with a simple structure and in a low-temperature process like a transistor including a channel formed of amorphous silicon. In addition, it is known that a transistor including a channel formed of an oxide semiconductor has a mobility higher than that of a transistor including a channel formed of amorphous silicon, and also has a very low off-current.

However, the mobility of the transistor including a channel formed of an oxide semiconductor is lower than that of the transistor including a channel formed of low-temperature polysilicon or single crystalline silicon. Therefore, in order to provide a higher on-current, the transistor including a channel formed of an oxide semiconductor needs to have a shorter L length (channel length) or a longer W length (channel width).

In order to shorten the L length of the transistor described in Japanese Laid-Open Patent Publication No. 2014-194579, a distance between a source and a drain needs to be shortened. The distance between a source and a drain is determined by a photolithography step and an etching step. In the case where patterning is performed by photolithography, size reduction is restricted by the size of a mask pattern of an exposure device. Especially in the case where patterning is performed on a glass substrate by photolithography, the minimum size of a mask pattern is about 2 μm, and the reduction in the channel length of the transistor is restricted by such a size of the mask pattern. The channel length of the transistor is restricted by photolithography, and therefore, is influenced by the in-plane variance of the substrate in the photolithography step.

In Japanese Laid-Open Patent Publication No. 2014-194579, a selective transistor in each of pixels needs to be located so as not to overlap a gate line or a data line. In the case where the W length of the transistor is increased, the ratio of an area occupied by the transistors in a pixel region is raised and thus the numerical aperture of the pixels is decreased.

SUMMARY

A display device in an embodiment according to the present invention includes a first electrode, a first insulating layer having a first top surface and a first side wall, the first side wall having a closed shape and being exposed to a first opening reaching the first electrode, an oxide semiconductor layer on the first side wall, the oxide semiconductor layer including a first portion and a second portion, the first portion being connected with the first electrode, a gate electrode facing the oxide semiconductor layer, a gate insulating layer between the oxide semiconductor layer and the gate electrode, a first transparent conductive layer above the first top surface, the first transparent conductive layer being connected with the second portion, and a second transparent conductive layer connected with the first transparent conductive layer, the second transparent conductive layer forming the same layer with the first transparent conductive layer.

A display device in an embodiment according to the present invention includes a first electrode, a first insulating layer having a first top surface and a first side wall, the first side wall having a closed shape and being exposed to a first opening reaching the first electrode, an oxide semiconductor layer on the first side wall, the oxide semiconductor layer including a first portion and a second portion, the first portion being connected with the first electrode, a gate electrode facing the oxide semiconductor layer, a gate insulating layer between the oxide semiconductor layer and the gate electrode, a first transparent conductive layer above the first top surface, the first transparent conductive layer being connected with the second portion, and a second transparent conductive layer connected with the first electrode, the second transparent conductive layer forming the same layer with the first transparent conductive layer.

DESCRIPTION OF EMBODIMENTS

Figure 1:
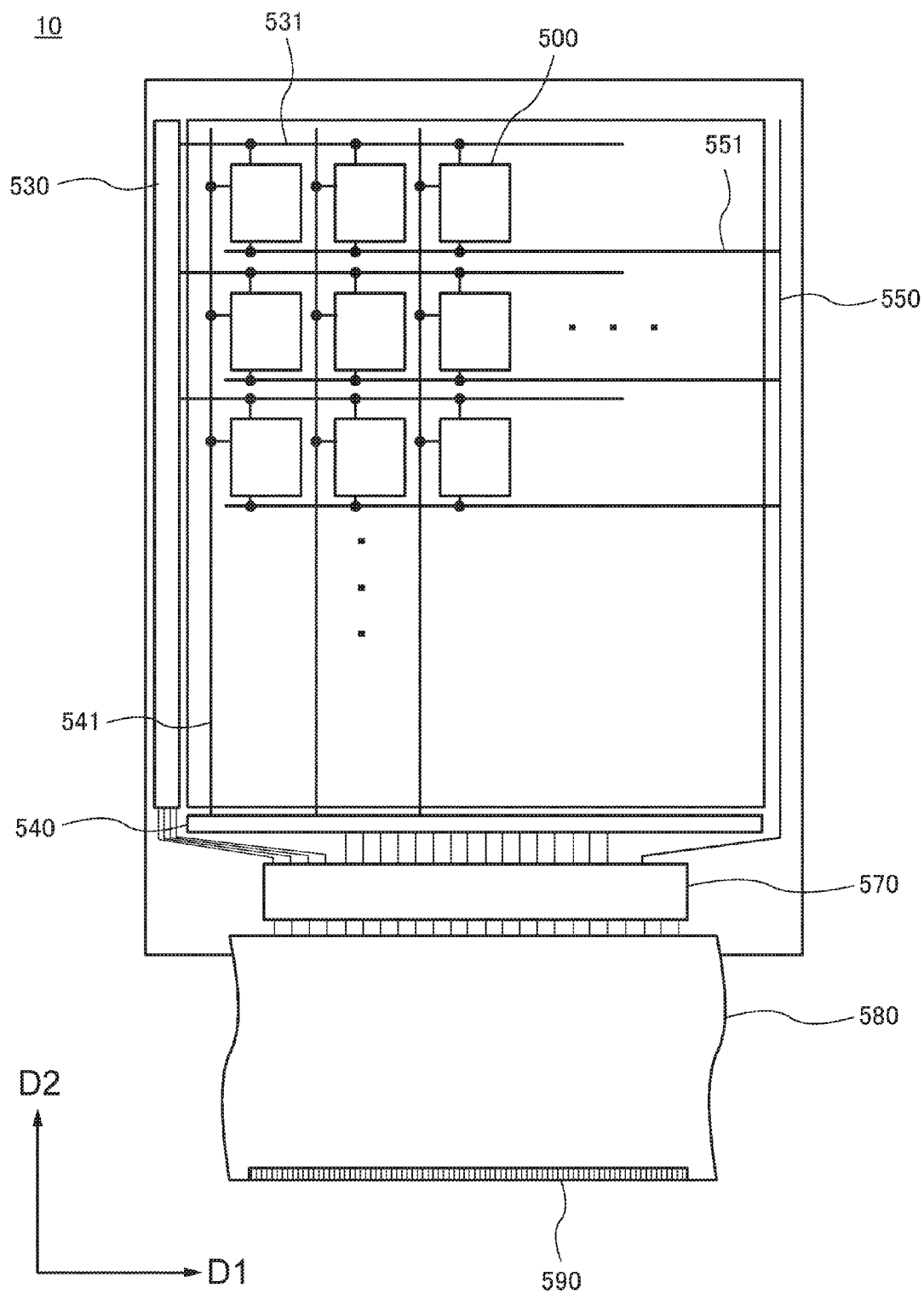
FIG. 1 is a plan view showing an overview of a display device in an embodiment according to the present invention.

Hereinafter, embodiments of the present invention will be described with reference to the drawings. The disclosure is merely exemplary, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a display device including a transistor capable of increasing the on-current or providing a display device having a high numerical aperture of pixels.

In the following description, an expression that "a first member and a second member are connected with each other" indicates that the first member and the second member are at least electrically connected with each other. Namely, the first member and the second member may be physically connected with each other directly, or another member may be provided between the first member and the second member. For example, an expression that an oxide semiconductor layer 140 is connected with a lower electrode 120 may indicate that the oxide semiconductor layer 140 and the lower electrode 120 are in direct contact with each other, or that another member is provided between the oxide semiconductor layer 140 and the lower electrode 120.

In the following description, different portions of one continuous layer may be expressed by different terms. For example, different portions of one continuous layer are respectively expressed by a term "gate line 531" and a different term "gate electrode 160" depending on the function or position of each of the portions. This is merely for the sake of explanation, and the "gate line 531" and "gate electrode 160" are not clearly distinguished from each other as different components. The "gate line 531" and "gate electrode 160" may be switched from each other in the description. The same is applicable to the terms "first transparent conductive layer 145" and "pixel electrode 520".

Embodiment 1

Figure 2A:
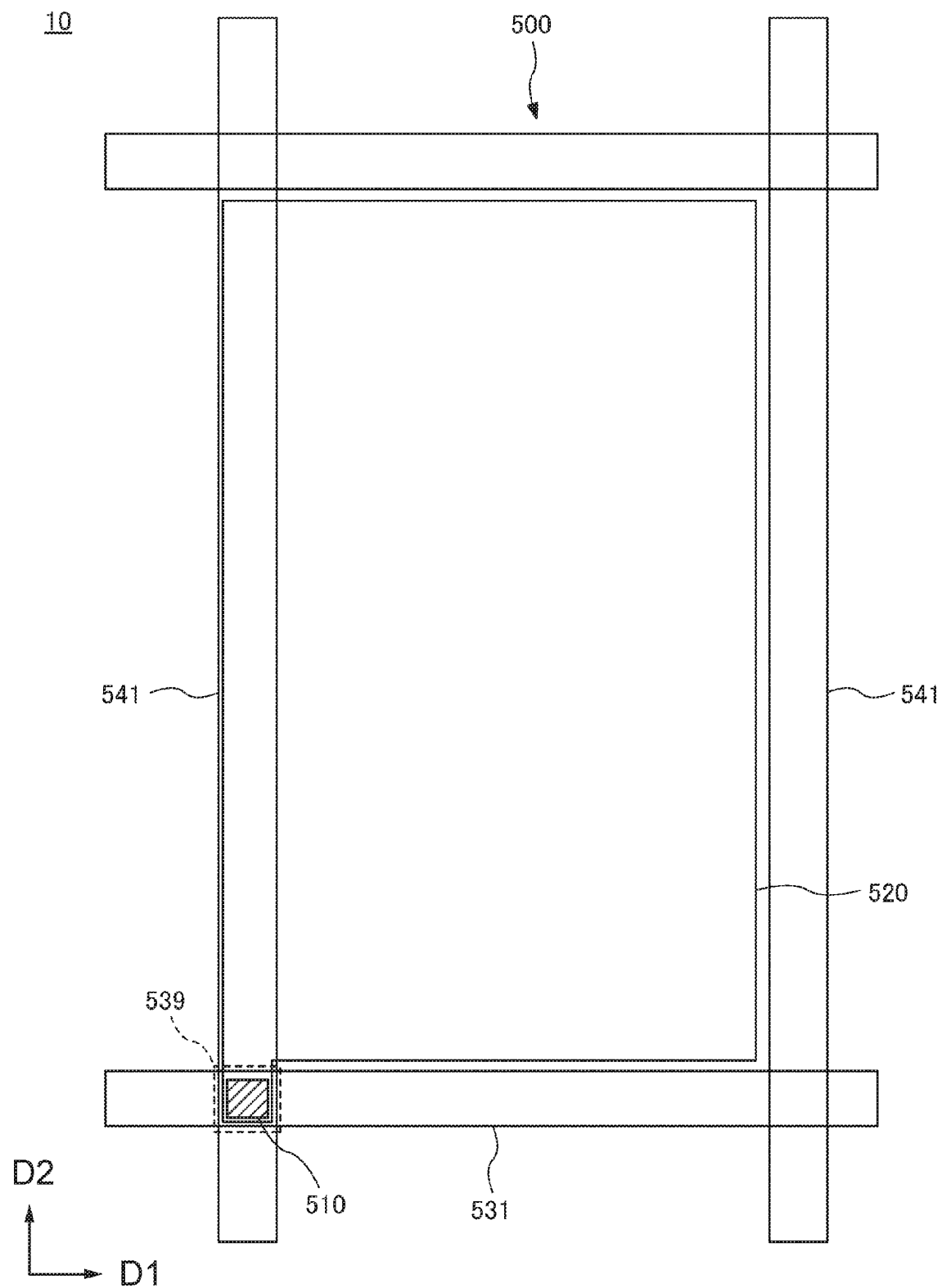
FIG. 2A is a plan view showing a selective transistor region and a pixel region of the display device in the embodiment according to the present invention.
Figure 2B:
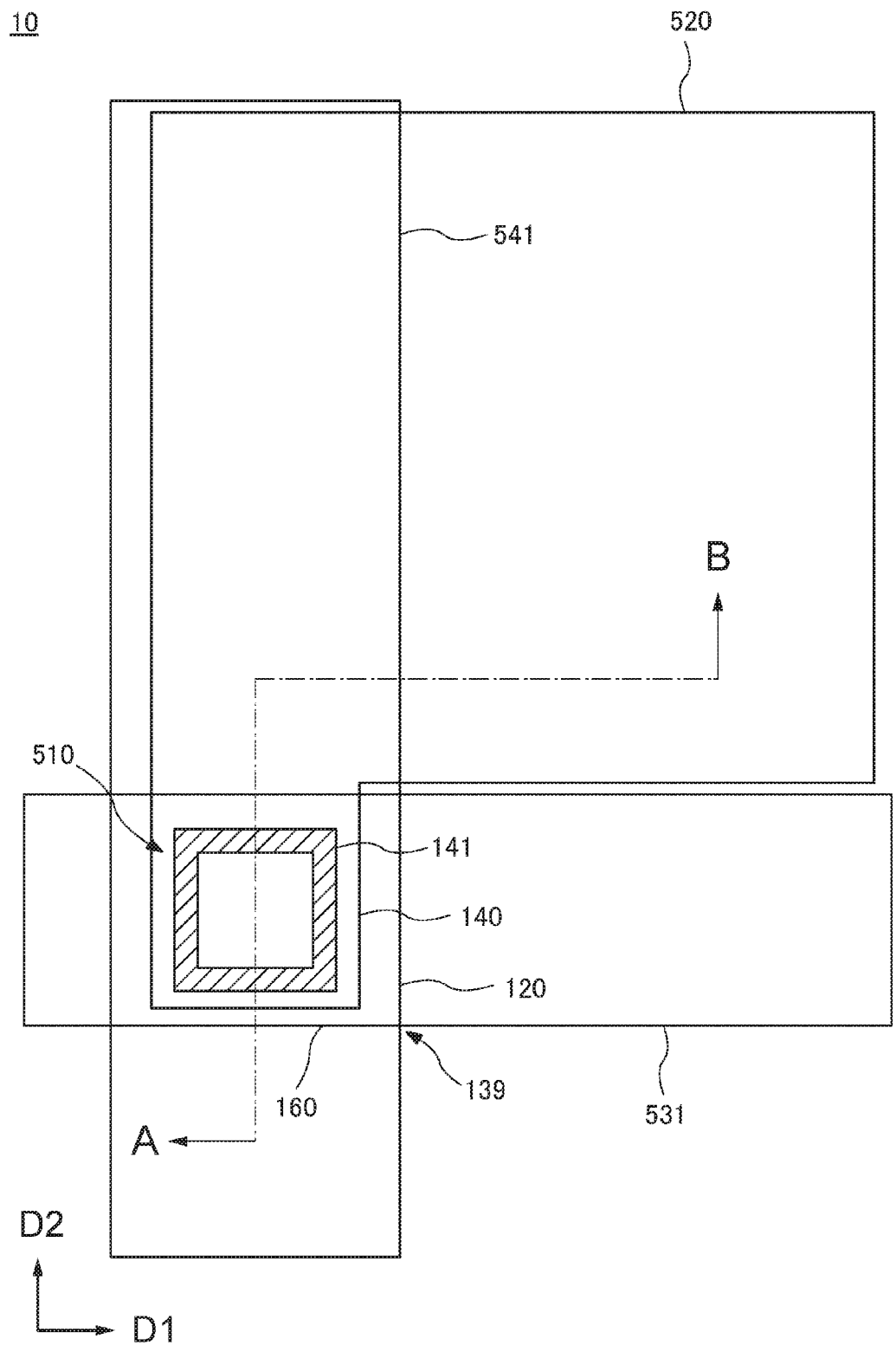
FIG. 2B is an enlarged plan view showing the selective transistor region and the pixel region of the display device in the embodiment according to the present invention.
Figure 3:
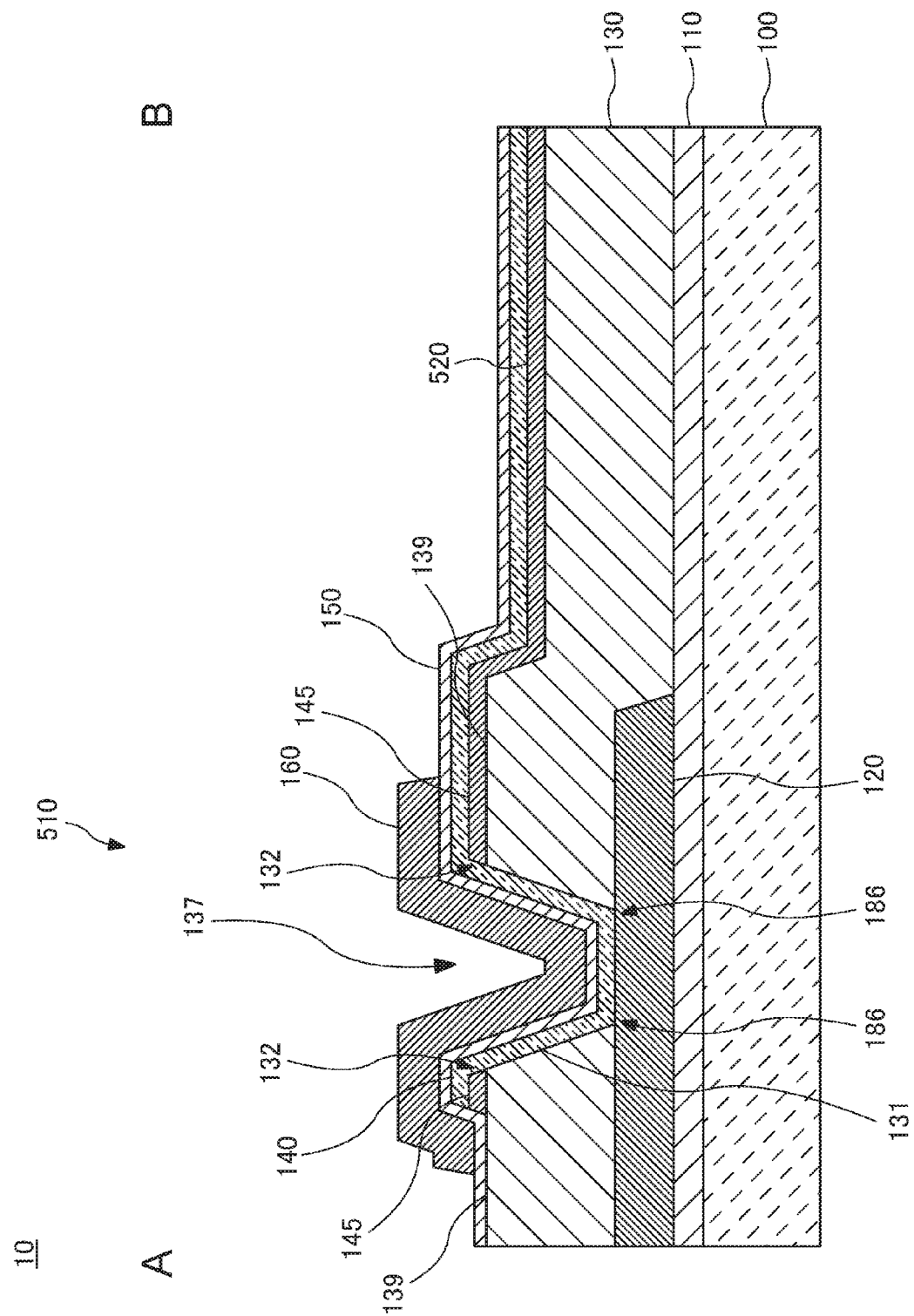
FIG. 3 is a cross-sectional view taken along line A-B in FIG. 2B showing the selective transistor region and the pixel region of the display device in the embodiment according to the present invention.

With reference to FIG. 1 through FIG. 3, an overview, a pixel layout and a cross-sectional structure of a display device 10 in embodiment 1 according to the present invention will be described. The display device 10 in embodiment 1 is a liquid crystal display device including a transistor array substrate. In embodiment 1, the transistor array substrate of the liquid crystal display device will be described. The display device according to the present invention is not limited to a liquid crystal display device, and the present invention is applicable to a light emission-type display device, for example, an organic EL display device or the like using an organic light-emitting diode (OLED) or an inorganic EL display device or the like using a light-emitting element, and is also applicable to an electronic paper or the like.

[Overview of the Display Device 10]

FIG. 1 is a plan view showing an overview of the display device 10 in embodiment 1 according to the present invention. FIG. 1 shows a simple circuit configuration of a transistor array substrate including transistors and lines. The transistor array substrate includes a plurality of pixels 500 located in a matrix including M rows×N columns (M and N are each a natural number). The pixels 500 are each controlled by a gate driver circuit 530 and a data driver circuit 540. The pixels 500 are each connected with a common wiring line 550.

The gate driver circuit 530 is a driver circuit that selects a row to which a data signal corresponding to the gray scale of each pixel 500 is to be supplied. The gate driver circuit 530 is connected with gate lines 531. The gate lines 531 extend in a first direction D1 and are each provided for the pixels 500 in a corresponding row. The data driver circuit 540 is a driver circuit that supplies a data signal to each of the pixels 500. The data driver circuit 540 is connected with data lines 541. The data lines 541 extend in a second direction D2 and are each provided for the pixels 500 in a corresponding column. The common wiring line 550 is a line provided with a common voltage, and is commonly connected with the pixels 500 via common lines 551 extending in the first direction D1. The data driver circuit 540 sequentially provides data signals to pixels 500 in the rows selected by the gate driver circuit 530.

The gate driver circuit 530 and the data driver circuit 540 are connected with a driver IC 570 respectively via lines. The common wiring line 550 is also connected with the driver IC 570. The driver IC 570 is connected with an FPC 580 via lines. The FPC 580 includes an external terminal 590 connectable with an external device. In the example shown in FIG. 1, the gate driver 530, the data driver 540 and the common wiring line 550 are all connected with the driver IC 570. The display device 10 is not limited to having such a structure. For example, a part of, or the entirety of, the gate driver 530, the data driver 540 and the common wiring line 550 may be directly connected with the FPC 580, not via the driver IC 570.

[Pixel Layout of the Display Device 10]

FIG. 2A is a plan view showing a selective transistor region and a pixel region of the display device 10 in embodiment 1 according to the present invention. As shown in FIG. 2A, the pixel 500 includes the gate line 531 extending in the first direction D1, the data line 541 extending in the second direction D2 crossing the first direction D1, a selective transistor 510 located at a crossing point 539 of the gate line 531 and the data line 541, and a pixel electrode 520 connected with the data line 541 via the selective transistor 510. Although not shown, a storage capacitance may be provided between the selective transistor 510 and the pixel electrode 520.

In the layout shown in FIG. 2A, the gate line 531 and the data line 541 are straight and cross each other perpendicularly as seen in a plan view. The display device 10 is not limited to having such a layout. For example, one of, or both of, the gate line 531 and the data line 541 may be curved while extending in the first direction D1 or the second direction D2. At the crossing point 539, the gate line 531 and the data line 541 may cross each other at an angle other than 90 degrees.

In the layout shown in FIG. 2A, the pixel electrode 520 is offset from the gate line 531 and the data line 541 except for a part thereof, namely, the pixel electrode 520 does not overlap the gate line 531 or the data line 541 except for a part thereof, as seen in a plan view. The display device 10 is not limited to having such a layout. For example, an outer peripheral area of the pixel electrode 520 may overlap the gate line 531 or the data line 541 as seen in a plan view.

In the display device 10 shown in FIG. 2A, the selective transistor 510 is controlled to be on or off by a gate voltage supplied by the gate line 531. More specifically, a predetermined gate voltage is applied to the gate line 531, so that the selective transistor 510 is turned on to connect the data line 541 and the pixel electrode 520 with each other. As a result of the selective transistor 510 being turned on, a data signal corresponding to the gray scale of the pixel supplied to the data line 541 is supplied to the pixel electrode 520 via the selective transistor 510.

Although not shown, a counter substrate is provided to face the transistor array substrate including the pixel electrode 520, and a liquid crystal material is held between the transistor array substrate and the counter substrate. A common electrode (not shown) to be supplied with a common voltage is included in the counter substrate. Namely, in the display device 10, the liquid crystal material is aligned by an electric field in a longitudinal direction (direction vertical to a surface of a substrate 100 (FIG. 3) on which the selective transistor 510 and the like are provided) generated between the pixel electrode 520 and the common electrode.

[Structure of the Display Device 10]

Now, a structure of the selective transistor 510 and the pixel electrode 520 will be described in detail with reference to plan views and cross-sectional views. In the following example of embodiment 1, the selective transistor 510 includes a channel formed of an oxide semiconductor. The selective transistor 510 is not limited to having to such a structure, and may include a channel formed of a semiconductor such as silicon or the like, a compound semiconductor such as Ga—As or the like, or an organic semiconductor such as pentacene, tetracyanoquinodimethane (TCNQ) or the like.

FIG. 2B is an enlarged plan view showing the selective transistor region and the pixel region of the display device 10 in embodiment 1 according to the present invention. FIG. 3 is a cross-sectional view taken along line A-B in FIG. 2B showing the selective transistor region and the pixel region of the display device 10 in embodiment 1 according to the present invention. First, a structure of the display device 10 will be described with reference to the cross-sectional view. As shown in FIG. 3, the display device 10 includes a substrate 100, an underlying layer 110 provided on the substrate 100, a lower electrode 120 provided on the underlying layer 110, a first insulating layer 130 having a first side wall 131 of a ring shape exposed to a first opening 137 reaching the lower electrode 120 and also having a first top surface 139, and a first transparent conductive layer 145 provided above the first top surface 139. The "ring shape" may also be expressed as a "closed shape" or a "shape enclosing an area". In FIG. 2B, the ring-shaped first side wall 131 is, for example, of a closed square ring shape. Alternatively, the ring-shaped first side wall 131 may have a circular ring shape or a polygonal ring shape other than the square ring shape.

The display device 10 also includes an oxide semiconductor layer 140 provided on the first side wall 131 and on the first transparent conductive layer 145, a gate electrode 160 provided to face a portion of the oxide semiconductor layer 140 that is located on the first side wall 131, and a gate insulating layer 150 provided between the oxide semiconductor layer 140 and the gate electrode 160. The first transparent conductive layer 145 is located between the oxide semiconductor layer 140 and the first insulating layer 130 and is connected with one portion (first portion) of the oxide semiconductor layer 140 in a region 132. The lower electrode 120 is connected with another portion (second portion) of the oxide semiconductor layer 140 in a region 186. The display device 10 further includes a pixel electrode 520 that is connected with the first transparent conductive layer 145 and forms the same layer with the first transparent conductive layer 145. The pixel electrode 520 is supplied with a data signal corresponding to the gray scale of the corresponding pixel as described above.

As shown in FIG. 3, the first side wall 131 of the first insulating layer 130 has a tapered inclining surface tending to open upward (the first opening 137 expands upward; forward tapered). The first opening 137 of the first insulating layer 130 has a pattern having, as an end, an inner perimeter of a hatched region (channel region 141) in FIG. 2B. The first side wall 131 located at the end of the first opening 137 in the first insulating layer 130 is provided in a ring shape along an inner circumferential surface of the first opening 137 shown as the hatched region (channel region 141) in FIG. 2B.

As shown in FIG. 2B, the gate electrode 160 is a part of the gate line 531, and the lower electrode 120 is a part of the data line 541. In other words, the gate electrode 160 is included in the gate line 531, and the lower electrode 120 is included in the data line 541. In still other words, the gate line 531 is connected with the gate electrode 160, and the data line 541 is connected with the lower electrode 120.

Now, a shape and a material of each of the layers included in the above-described display device 10 will be described in more detail.

The substrate 100 may be a glass substrate. Alternatively, the substrate 100 may be a substrate formed of a light-transmissive insulating material, for example, a quartz substrate, a sapphire substrate, or a resin substrate. In the case where the display device 10 is a flexible display device, the substrate 100 may be formed of a flexible material. The flexible material may be a resin material. The resin material may be, for example, a polyimide resin, an acrylic resin, an epoxy resin or the like. Alternatively, such a resin material containing impurities that improve the heat resistance of the substrate may be used.

The underlying layer 110 may be formed of a material that suppresses diffusion of impurities from the substrate 100 into the oxide semiconductor layer 140. For example, the underlying layer 110 may be formed of silicon nitride ($SiN_x$), silicon nitride oxide ($SiN_xO_y$), silicon oxide ($SiO_x$), silicon oxide nitride ($SiO_xN_y$), aluminum nitride ($AlN_x$), aluminum nitride oxide ($AlN_xO_y$), aluminum oxide ($AlO_x$), aluminum oxide nitride ($AlO_xN_y$), or the like (x and y each represent an arbitrary value). Alternatively, the underlying layer 110 may have a structure including a stack of films of such materials.

$SiO_xN_y$ is a silicon compound containing nitrogen (N) at a lower content than oxygen (O). $AlO_xN_y$ is an aluminum compound containing nitrogen (N) at a lower content than oxygen (O). $SiN_xO_y$ is a silicon compound containing oxygen at a lower content than nitrogen. $AlN_xO_y$ is an aluminum compound containing oxygen at a lower content than nitrogen.

The underlying layer 110 described above may be formed of a thin film, the thickness of which is controllable by a nanometer order (range less than 1 μm). Such a thin film, the thickness of which is controllable by a nanometer order, may be formed by a PVD (Physical Vapor Deposition) method or a CVD (Chemical Vapor Deposition) method. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (catalytic-CVD or hot-wire CVD), and the like. A method other than the above-listed vapor deposition methods may be used as long as the film thickness can be controlled by a nanometer order.

The lower electrode 120 may be formed of a common metal material or a common conductive material. For example, the lower electrode 120 may be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the lower electrode 120 may be formed of an alloy of such materials or a nitride of such materials. Still alternatively, the lower electrode 120 may be formed of a conductive oxide such as ITO (indium tin oxide), IGO (indium gallium oxide), IZO (indium zinc oxide), GZO (zinc oxide containing gallium as a dopant), or the like. The lower electrode 120 may have a structure including a stack of films of such materials. The lower electrode 120 may be formed of a thin film, the thickness of which is controllable by a nanometer order, like the underlying layer 110.

Preferably, the material used for the lower electrode 120 is resistant to a heat treatment in a manufacturing process of a display device including a transistor that includes a channel formed of an oxide semiconductor, and has a low contact resistance with the oxide semiconductor layer 140 to be formed thereon. In order to have a good electrical contact with the oxide semiconductor layer 140, the lower electrode 120 may be formed of a metal material having a work function smaller than that of the oxide semiconductor layer 140. During the formation of the oxide semiconductor layer 140 on the lower electrode 120, a surface of the lower electrode 120 is exposed to an oxygen atmosphere. Therefore, in order to have a good electrical contact with the oxide semiconductor layer 140, the lower electrode 120 may be formed of a material with which at least an outermost surface of the lower electrode 120 is not easily oxidized. Alternatively, the lower electrode 120 may be formed of a material with which at least the outermost surface of the lower electrode 120 is not highly resistant even though being oxidized.

The first insulating layer 130 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110. Alternatively, the first insulating layer 130 may be formed of an organic insulating material such as a polyimide resin, an acrylic resin, an epoxy resin, a silicone resin, a fluorine resin, a siloxane resin, or the like. The first insulating layer 130 is formed of a thin film, the thickness of which is controllable by a nanometer order, and may be formed by substantially the same method as that of the underlying layer 110. The first insulating layer 130 and the underlying layer 110 may be formed of the same material as, or different materials from, each other.

In the example shown in FIG. 3, the first side wall 131 has a cross-section with the forward tapered first side wall 131 being linear. The first insulating layer 130 is not limited to having this structure. The forward tapered first side wall 131 may be curved as protruding outward or curved as protruding inward. Instead of being forward tapered, the first side wall 131 may be vertical with respect to the surface of the substrate 100, or reverse tapered, namely, incline while tending to open downward.

In the example shown in FIG. 3, the first insulating layer 130 is formed of a single layer. The first insulating layer 130 is not limited to having this structure, and may include a stack of a plurality of different layers. In this case, the tapering angle and the shape of the first side wall 131 may be different layer by layer. Alternatively, the first insulating layer 130 may include a stack of layers of different properties (e.g., $SiN_x$ and $SiO_x$) such that different portions, along the first side wall 131, of the oxide semiconductor layer 140 have different properties. Namely, the transistor in the display device 10 may have a channel formed of portions of the oxide semiconductor layer 140 that are of different characteristics and are connected with each other in series.

The first transparent conductive layer 145 and the pixel electrode 520 may be formed of a common light-transmissive conductive material. For example, the first transparent conductive layer 145 and the pixel electrode 520 may be formed of a conductive oxide such as ITO (indium tin oxide), IGO (indium gallium oxide), IZO (indium zinc oxide), ZnO (zinc oxide), $SnO_2$ (tin oxide), $In_2O_3$ (indium oxide), GZO (zinc oxide containing gallium as a dopant), titanium oxide containing an impurity such as niobium or the like as a dopant, or the like. The first transparent conductive layer 145 and the pixel electrode 520 may have a structure including a stack of films of such materials.

The oxide semiconductor layer 140 may be formed of a metal oxide material having the characteristics of a semiconductor. For example, the oxide semiconductor layer 140 may be formed of an oxide semiconductor containing indium (In), gallium (Ga), Zinc (Zn) and oxygen (O). Especially, the oxide semiconductor layer 140 may be formed of an oxide semiconductor having a composition ratio of In:Ga:Zn:O=1:1:1:4. It should be noted that the oxide semiconductor used in the present invention and containing In, Ga, Zn and O is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased. The oxide semiconductor layer 140 may be formed of a thin film, the thickness of which is controllable by a nanometer order.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), or the like may be used. The oxide semiconductor layer 140 may be amorphous or crystalline. Alternatively, the oxide semiconductor layer 140 may have a mixed phase of an amorphous phase and a crystalline phase.

The gate insulating layer 150 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110 and the first insulating layer 130. Alternatively, the gate insulating layer 150 may have a structure including a stack of insulating films of such materials. The gate insulating layer 150 is formed of a thin film, the thickness of which is controllable by a nanometer order, and may be formed by substantially the same method as that of the underlying layer 110. The gate insulating layer 150, the underlying layer 110 and the first insulating layer 130 may be formed of the same material as, or different materials from, each other.

The gate electrode 160 may be formed of any of substantially the same materials as those described above regarding the lower electrode 120. The gate electrode 160 may be formed of the same material as, or a different material from, that of the lower electrode 120. Preferably, the material used for the gate electrode 160 is resistant to a heat treatment in a manufacturing process of a transistor including a channel formed of an oxide semiconductor, and has a work function with which the transistor is of an enhancement type that is turned off when the gate electrode is of 0 V. The gate electrode 160 is formed of a thin film, the thickness of which is controllable by a nanometer order. In the example shown in FIG. 3, the gate electrode 160 is formed of a single layer. The gate electrode 160 is not limited to having this structure, and may include a stack of a plurality of different layers.

[Operation of the Display Device 10]

With reference to FIG. 2B and FIG. 3, an operation of the display device 10 for driving the pixels 500 will be described. As shown in FIG. 2B, the display device 10 includes the gate line 531, the data line 541, the selective transistor 510, and the pixel electrode 520. The selective transistor 510 uses the oxide semiconductor layer 140 as a channel. The gate line 531 is connected with the gate electrode 160. The data line 541 is connected with the lower electrode 120. The pixel electrode 520 is connected with the selective transistor 510 on the drain side. As a result of the selective transistor 510 being turned on, the pixel electrode 520 is connected with the data line 541 via the selective transistor 510.

First, the gate electrode 531 is supplied with a gate voltage that turns the selective transistor 510 on, so that the gate electrode 160 is also supplied with the gate voltage. Based on the gate voltage applied to the gate electrode 160, an electric field is generated in the oxide semiconductor layer 140 via the gate insulating layer 150. As a result, a channel is formed in the portion of the oxide semiconductor layer 140 that is located on the first side wall 131. Since the first side wall 131 is in a ring shape, a ring-shaped channel region 141 is formed as shown in FIG. 2B. The channel region 141 of the selective transistor 510 is ring-shaped as shown in FIG. 2B. Such a structure is referred to as "surround type", and such a transistor is referred to as a "surround-type transistor".

When a data signal is applied to the data line 541 in the state where the channel region 141 is formed in the oxide semiconductor layer 140, the data signal is supplied to the pixel electrode 520 via the lower electrode 120, the channel region 141 and the first transparent conductive layer 145. Namely, the lower electrode 120 acts as a source electrode, and the first transparent conductive layer 145 acts as a drain electrode. Then, the gate voltage applied to the gate line 531 is changed to such a level that turns the selective transistor 510 off, so that the selective transistor 510 is turned off, and the pixel electrode 520 is kept in the state of being supplied with the data signal. Between the pixel electrode 520 and the common electrode provided in the counter substrate, an electric field based on a potential difference between these electrodes is formed, and the liquid crystal material is aligned by the electric field.

Namely, in the display device 10, the gate electrode 160 of the selective transistor 510, the lower electrode 120 acting as the source electrode of the selective transistor 510, and the first transparent conductive layer 145 acting as the drain electrode of the selective transistor 510 may be located to overlap the gate line 531 or the data line 541 as seen in a plan view. More specifically, the selective transistor 510 may be formed in an area in which the gate line 531 and the data line 541 cross each other, namely, in a crossing area including the crossing point 539.

The selective transistor 510 using the oxide semiconductor layer 140 as the channel has a very low off-current. Therefore, the data signal supplied to the pixel electrode 520 is maintained until a data signal is supplied in a next frame. As necessary, a storage capacitance that holds the data signal supplied to the pixel electrode 520 may be provided. In the example shown in FIG. 2B and FIG. 3, the oxide semiconductor layer 140 extends to a region where the oxide semiconductor layer 140 does not overlap the gate electrode 160 as seen in a plan view. The oxide semiconductor layer 140 is not limited to having such a structure, and may not be located in a region where the oxide semiconductor layer 140 does not overlap the gate electrode 160 as seen in a plan view.

As described above, in the display device 10, the portion of the oxide semiconductor layer 140 that is located on the first side wall 131 acts as the channel region 141. Therefore, the channel length of the display device 10 is controlled by the thickness of the first insulating layer 130 and the tapering angle of the first side wall 131.

As described above, in the display device 10 in embodiment 1 according to the present invention, the portion of the oxide semiconductor layer 140 that is located on the first side wall 131 of the first insulating layer 130 acts as a channel. Therefore, the channel length of the selective transistor 510 may be controlled by controlling either the thickness of the first insulating layer 130 or the tapering angle of the first side wall 131, or by controlling both of the thickness of the first insulating layer 130 and the tapering angle of the first side wall 131. As described above, the first insulating layer 130 is formed of a thin film, the thickness of which is controllable by a nanometer order. Therefore, the selective transistor 510 may have a channel length shorter than the limit of patterning by photolithography, by which variance is of a micrometer order. As a result, the selective transistor 510 of the display device 10 is capable of increasing the on-current.

In the display device 10 in embodiment 1 according to the present invention, the selective transistor 510 is located at the crossing point 539 at which the gate line 531 and the data line 541 cross each other. Therefore, the display device 10 has a high numerical aperture of the pixels 500. Since the first transparent conductive layer 145 is located, in the vicinity of the first side wall 131, between the first insulating layer 130 and the oxide semiconductor layer 140, the resistance of the selective transistor 510 when the selective transistor 510 turns on is further decreased.

In the display device in embodiment 1 according to the present invention, the oxide semiconductor layer 140 is located on the ring-shaped first side wall 131, and thus the channel region 141 is ring-shaped. Therefore, an end of the oxide semiconductor layer 140 is not included in the channel region 141. During the etching performed to form the oxide semiconductor layer 140, the end of the oxide semiconductor layer 140 may possibly have properties thereof changed. However, in the display device 10, the end of the oxide semiconductor layer 140 is not included in the channel region 141. Therefore, no leak path is generated by the end of the oxide semiconductor layer 140. Namely, the selective transistor 510 of the display device 10 has a still lower off-current.

In the display device 10 in embodiment 1 according to the present invention, the thickness of the first insulating layer 130 formed by a PVD method or a CVD method may be controlled by a nanometer order. Therefore, the in-plane variance of the thickness of the first insulating layer 130 may also be controlled by a nanometer order. The tapering angle of the first side wall 131 may be controlled by the etching rate of, and the retraction amount of a resist used to form, the first insulating layer 130. The variance of the etching rate and the retraction amount of the resist may also be controlled by substantially the same order as the variance of the thickness of the first insulating layer 130. Therefore, the in-plane variance of the thickness of the first insulating layer 130 and the tapering angle of the first side wall 131 is smaller than the in-plane variance of the patterning precision by photolithography. As a result, the selective transistor 510 of the display device 10 is capable of suppressing the in-plane variance of the channel length.

In the display device 10 in embodiment 1 according to the present invention, the inclining surface of the first side wall 131 is tapered. Therefore, the coverage of the oxide semiconductor layer 140 and the gate insulating layer 150 with respect to the first side wall 131 is improved. This improves the controllability on the thickness of the oxide semiconductor layer 140 and the gate insulating layer 150 formed on the first side wall 131. As a result, the selective transistor 510 of the display device 10 has little variance in the characteristics.

[Manufacturing Method of the Display Device 10]

With reference to plan views and cross-sectional views provided in FIG. 4 through FIG. 9, a manufacturing method of the display device 10 in embodiment 1 according to the present invention will be described.

Figure 4:
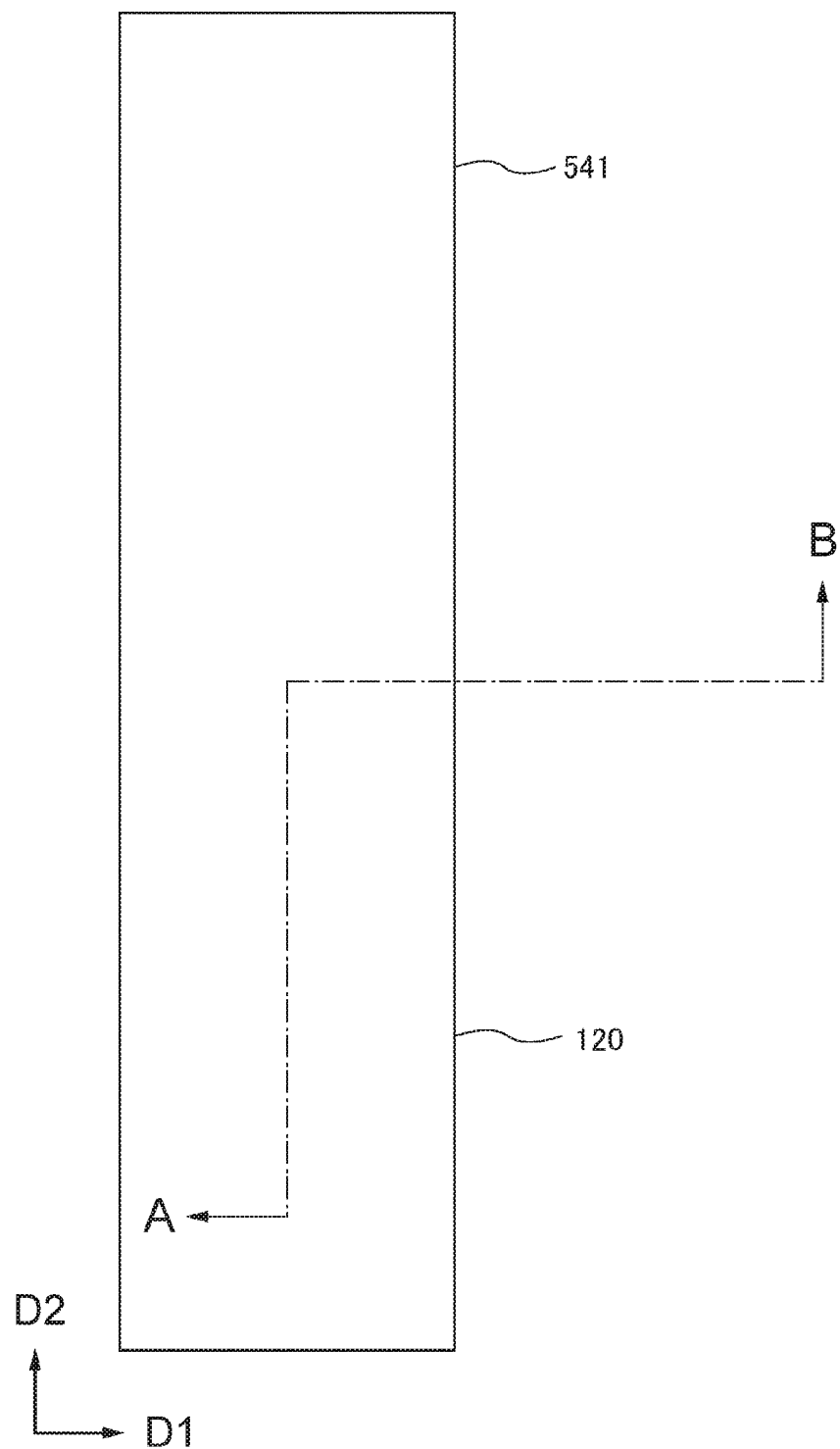
FIG. 4 is a plan view showing a step of forming an underlying layer and a lower electrode on a substrate in a manufacturing method of the display device in the embodiment according to the present invention.
Figure 5:
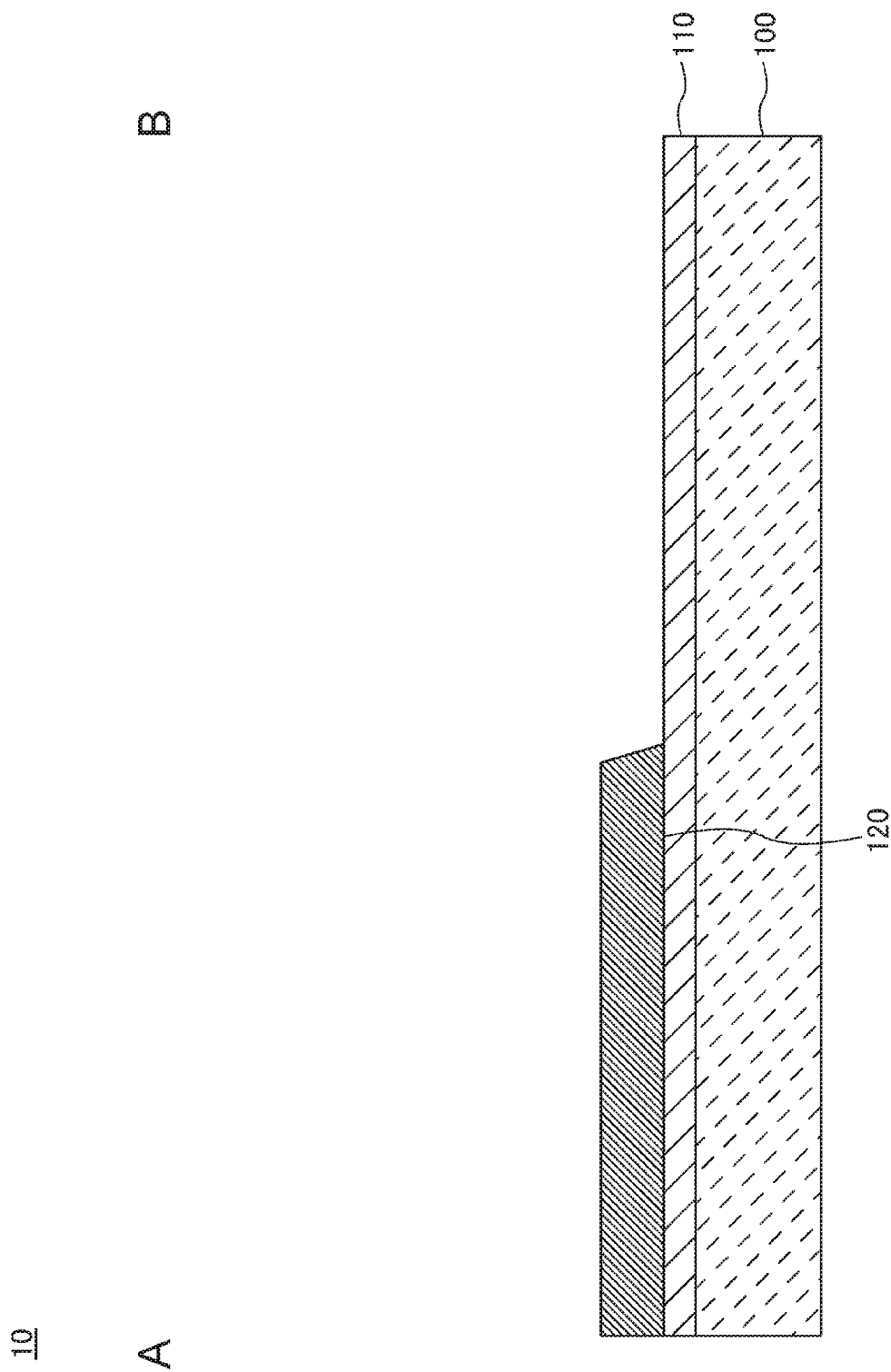
FIG. 5 is a cross-sectional view showing the step of forming the underlying layer and the lower electrode on the substrate in the manufacturing method of the display device in the embodiment according to the present invention.

FIG. 4 is a plan view showing a step of forming the underlying layer 110 and the lower electrode 120 on the substrate 100 in the manufacturing method of the display device 10 in embodiment 1 according to the present invention. FIG. 5 is a cross-sectional view showing the step of forming the underlying layer 110 and the lower electrode 120 on the substrate 100 in the manufacturing method of the display device 10 in embodiment 1 according to the present invention. Referring to FIG. 5, the underlying layer 110 and a film for the lower electrode 120 are formed on the substrate 100, and patterning is performed as shown in FIG. 4 by photolithography and etching to form the lower electrode 120 (and the data line 541). Preferably, the etching is performed to form the lower electrode 120 under the condition that the etching rate ratio of the lower electrode 120 with respect to the underlying layer 110 is high. In this and the following descriptions of manufacturing methods of semiconductor devices in embodiments according to the present invention, an assembly of the substrate 100 and the film(s) formed thereon at each step will be referred to as the "substrate" for the sake of convenience.

Figure 6:
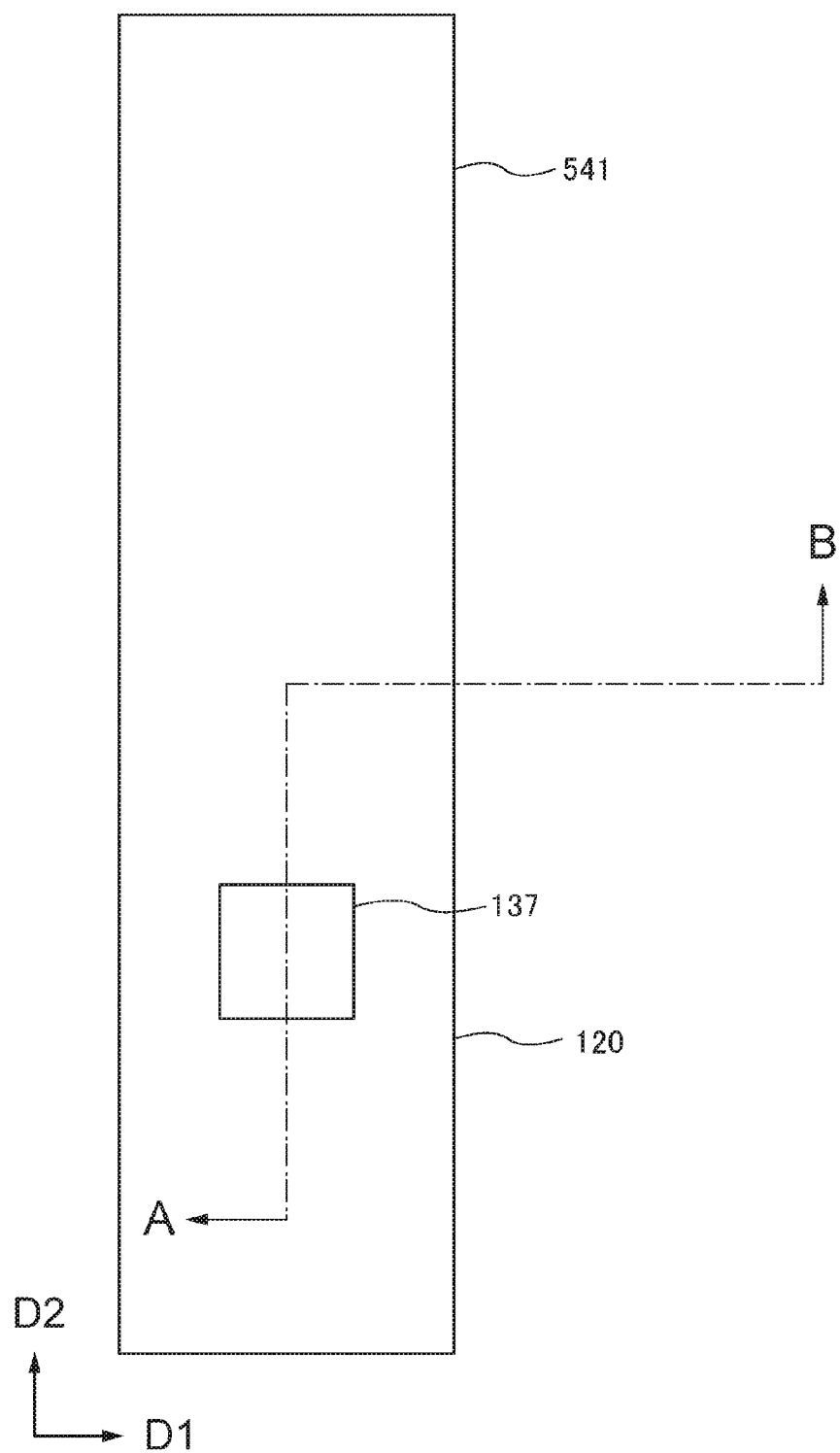
FIG. 6 is a plan view showing a step of forming a first insulating layer and a first transparent conductive layer in the manufacturing method of the display device in the embodiment according to the present invention.
Figure 7:
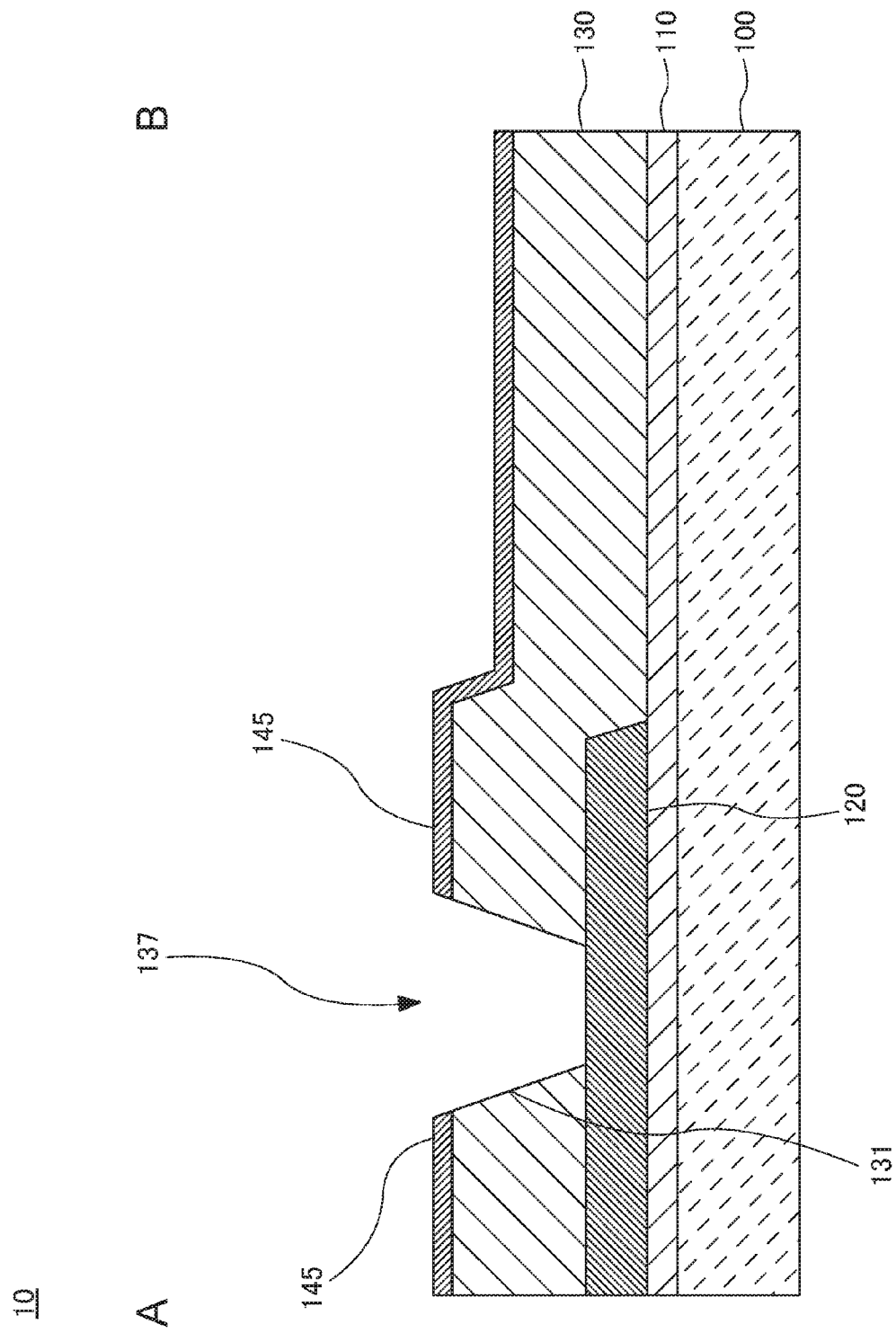
FIG. 7 is a cross-sectional view showing the step of forming the first insulating layer and the first transparent conductive layer in the manufacturing method of the display device in the embodiment according to the present invention.

FIG. 6 is a plan view showing a step of forming the first insulating layer 130 and the first transparent conductive layer 145 in the manufacturing method of the display device 10 in embodiment 1 according to the present invention. FIG. 7 is a cross-sectional view showing the step of forming the first insulating layer 130 and the first transparent conductive layer 145 in the manufacturing method of the display device 10 in embodiment 1 according to the present invention. Referring to FIG. 7, a film for the first insulating layer 130 and a film for the first transparent conductive layer 145 are formed on the entirety of the substrate shown in FIG. 5, more specifically, on the lower electrode 120 and the underlying layer 110; and the first opening 137 is formed by photolithography and etching as shown in FIG. 6.

The first insulating layer 130 and the first transparent conductive layer 145 may be formed together or in separate steps by etching. For example, an opening corresponding to the first opening 137 may be formed in the film for the first transparent conductive layer 145 by photolithography and etching to form the first transparent conductive layer 145, and the film for the first insulating layer 130 may be etched using the first transparent conductive layer 145 having the opening as a mask to form the first opening 137. Alternatively, after the first insulating layer 130 is formed by patterning, the film for the first transparent conductive layer 145 may be formed on the top surface and the first side wall 131 of the first insulating layer 130 and patterned by photolithography and etching to form the first transparent conductive layer 145.

The etching may be performed to form the first insulating layer 130 under the condition that the etching rate ratio of the first insulating layer 130 with respect to at least the lower electrode 120 is high. In the case where the first opening 137 reaches the lower electrode 120 and the underlying layer 110, the etching may be performed to form the first insulating layer 130 under the condition that the etching rate ratio of the first insulating layer 130 with respect to both of the lower electrode 120 and the underlying layer 110 is high. In the case where it is difficult to guarantee a high etching rate ratio of the first insulating layer 130 with respect to the underlying layer 110, for example, in the case where the first insulating layer 130 and the underlying layer 110 are formed of the same material, an etching stopper layer may be formed on the underlying layer 110. In the example shown in FIG. 6, the pattern of the first opening 137 is square. The first opening 137 is not limited to being square, and may be of any of various shapes, for example, circular, elliptical, polygonal, curved or the like.

Now, an etching method for forming the first side wall 131 of the first insulating layer 130 to be tapered will be described. The tapering angle of the first side wall 131 may be controlled by the etching rate of the first insulating layer 130 and the etching rate, in a horizontal direction, of a resist used as a mask to form the first insulating layer 130 by etching (in this specification, referred to as the "retraction amount of the resist"). In the case where, for example, the retraction amount of the resist is smaller than the etching rate of the first insulating layer 130, the tapering angle of the first side wall 131 is large (close to vertical). In the case where the retraction amount of the resist is zero, the first side wall 131 is vertical. By contrast, in the case where the retraction amount of the resist is larger than the etching rate of the first insulating layer 130, the tapering angle of the first side wall 131 is small (close to horizontal). The retraction amount of the resist may be adjusted by the tapering angle of an end of the resist and the etching rate of the resist.

Figure 8:
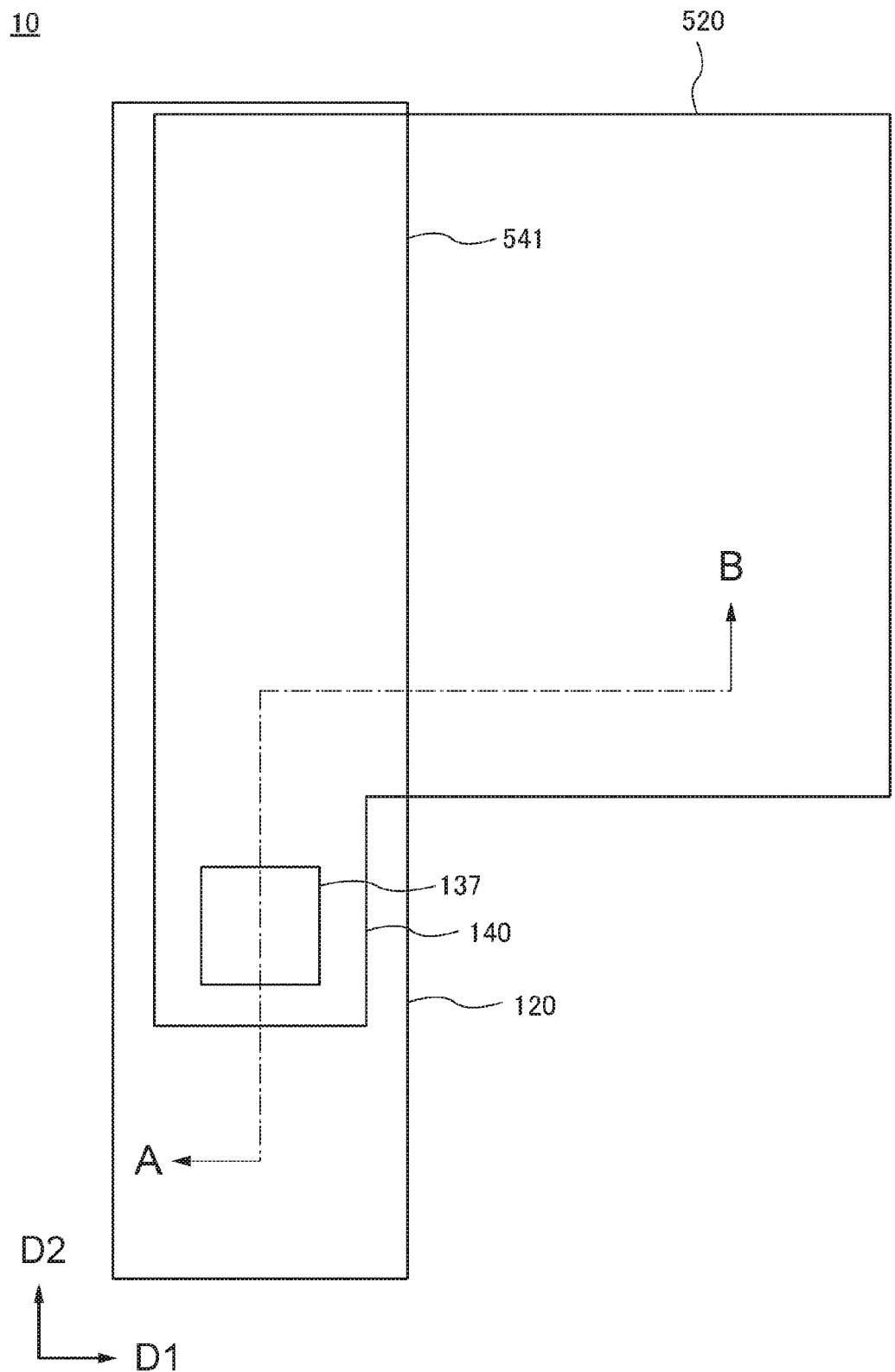
FIG. 8 is a plan view showing a step of forming an oxide semiconductor layer in the manufacturing method of the display device in the embodiment according to the present invention.
Figure 9:
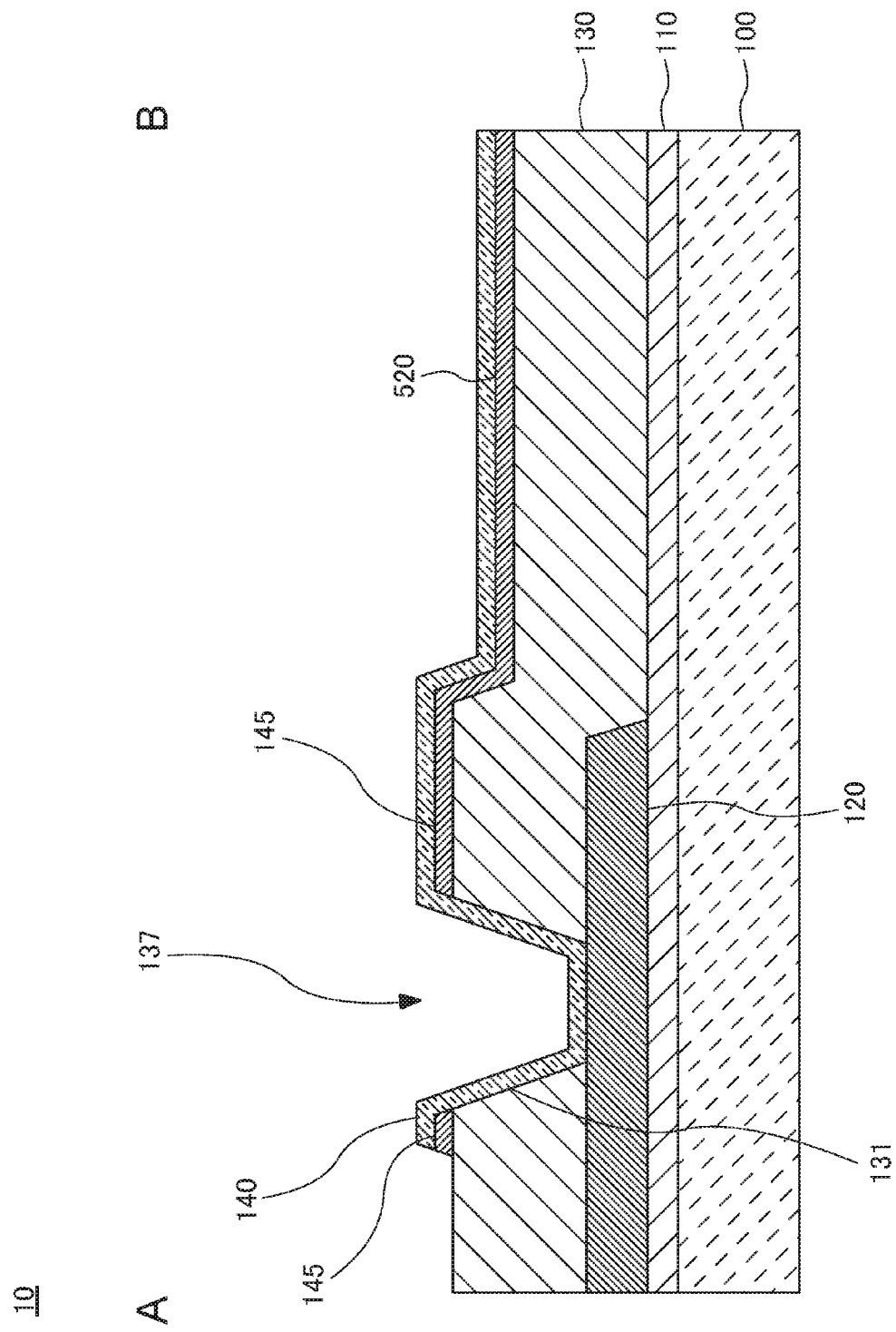
FIG. 9 is a cross-sectional view showing the step of forming the oxide semiconductor layer in the manufacturing method of the display device in the embodiment according to the present invention.

FIG. 8 is a plan view showing a step of forming the oxide semiconductor layer 140 in the manufacturing method of the display device 10 in embodiment 1 according to the present invention. FIG. 9 is a cross-sectional view showing the step of forming the oxide semiconductor layer 140 in the manufacturing method of the display device 10 in embodiment 1 according to the present invention. Referring to FIG. 9, a film for the oxide semiconductor layer 140 is formed on the entirety of the substrate shown in FIG. 7, and patterning is performed as shown in FIG. 8 by photolithography and etching to form the oxide semiconductor layer 140. The etching performed to form the oxide semiconductor layer 140 may be sputtering. It is sufficient that the oxide semiconductor layer 140 is formed to cover at least the first side wall 131 provided in a ring shape along the inner circumferential surface of the first opening 137.

When the oxide semiconductor layer 140 is formed by etching, the first transparent conductive layer 145 provided below the oxide semiconductor layer 140 is also etched. Such etching allows the pixel electrode 520 to be formed by patterning as shown in FIG. 8 in the step of forming the oxide semiconductor layer 140 by patterning. The etching performed to form the oxide semiconductor layer 140, the first transparent conductive layer 145 and the pixel electrode 520 may be dry etching or wet etching. In the case where the oxide semiconductor layer 140, the first transparent conductive layer 145 and the pixel electrode 520 are formed by wet etching, an etchant containing oxalic acid may be used.

In the example shown in FIG. 9, the oxide semiconductor layer 140 is formed on the entirety of the first side wall 131.

The oxide semiconductor layer 140 is not limited to having such a structure, and may be provided to cover, for example, a part of the first side wall 131. The first side wall 131 may have an area on which the oxide semiconductor layer 140 is not formed. In the example of manufacturing method shown in FIG. 9, a portion of the oxide semiconductor layer 140 that is located on the pixel electrode 520 is not removed. The display device 10 is not limited to being manufactured by such a method, and the portion of the oxide semiconductor layer 140 that is located on the pixel electrode 520 may be removed.

The gate insulating layer 150 and a film for the gate electrode 160 are formed on the entirety of the substrate shown in FIG. 9, and patterning is performed as shown in FIG. 2B and FIG. 3 by photolithography and etching to form the gate electrode 160. As shown in FIG. 2B, the gate electrode 160 is provided to cover the ring-shaped first side wall 131 as seen in a plan view. The display device 10 shown in FIG. 2B and FIG. 3 in embodiment 1 according to the present invention is manufactured by the manufacturing method described above. Referring to FIG. 3, the portion of the oxide semiconductor layer 140 that is located on the first side wall 131 is the channel region 141. Namely, as shown in FIG. 2B, the channel region 141 is formed in an area of the oxide semiconductor layer 140 that is covered with the gate electrode 160. In other words, the channel region 141 of the selective transistor 510 is formed in a ring shape along the first side wall 131, and is of a surround type which does not include the end of the oxide semiconductor layer 140.

As described above, according to the manufacturing method of the display device 10 in embodiment 1 of the present invention, the first insulating layer 130 and the first transparent conductive layer 145 are formed at the same time by etching, and the first transparent conductive layer 145 and the oxide semiconductor layer 140 are formed at the same time by etching. Therefore, the step of forming the first transparent conductive layer 145 by etching does not need to be provided separately, which allows the display device 10 to be manufactured with a smaller number of steps. This improves the productivity and decreases the production cost.

Modification 1 of Embodiment 1

Figure 10:
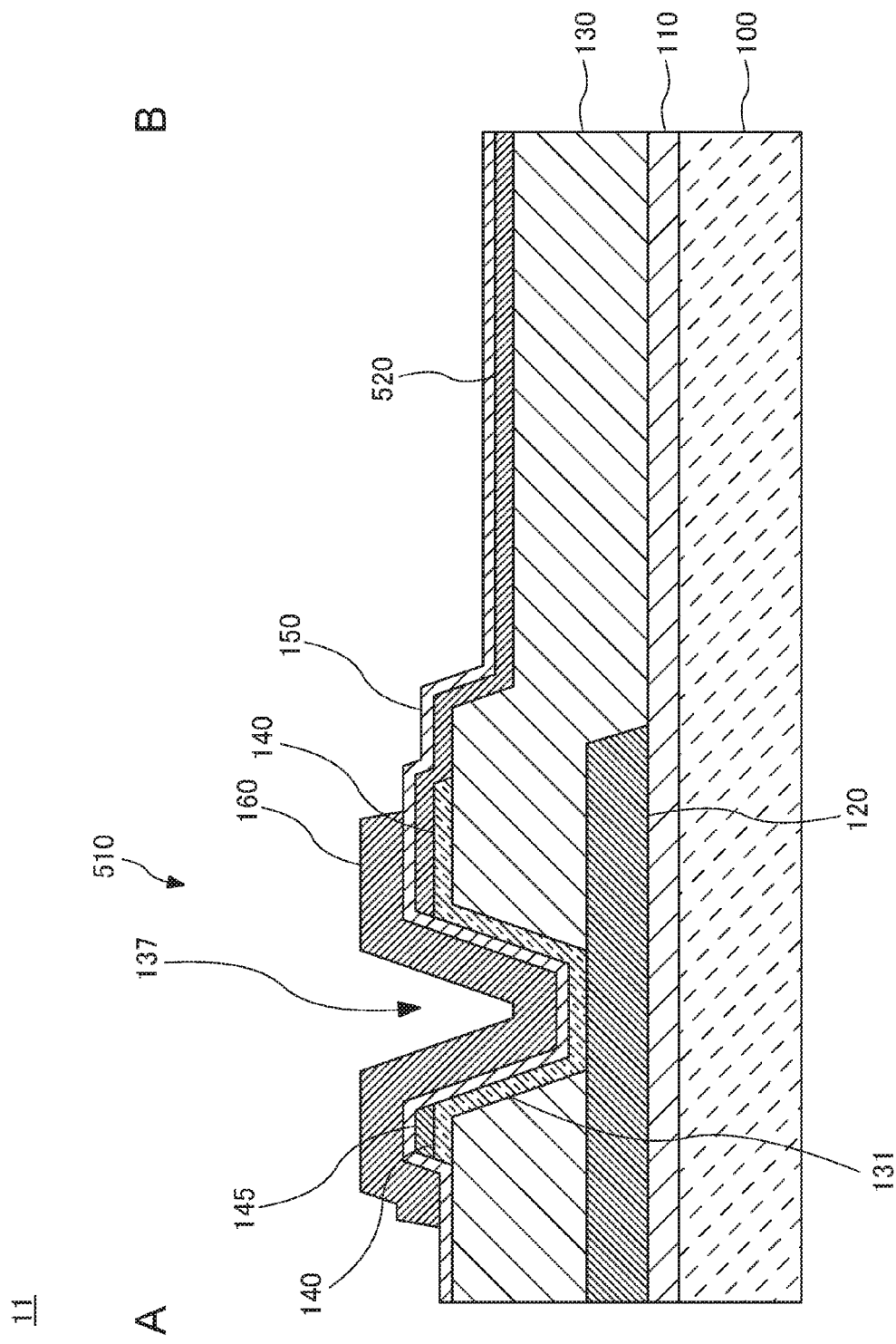
FIG. 10 is a cross-sectional view taken along line A-B in FIG. 2B showing a selective transistor region and a pixel region of a display device in a modification of the embodiment according to the present invention.

With reference to FIG. 10, modification 1 of embodiment 1 according to the present invention will be described. A display device 11 in modification 1 of embodiment 1 is similar to the display device 10 described in embodiment 1. In the following description, the identical component to, or the components having the identical functions to, those of the display device 10 will bear the identical reference numerals thereto, and detailed descriptions thereof will be omitted.

[Structure of the Display Device 11]

FIG. 10 is a cross-sectional view of a selective transistor region and a pixel region of the display device 11 in modification 1 of embodiment 1 according to the present invention. The display device 11 shown in FIG. 10 is similar to the display device 10 shown in FIG. 3. Unlike in the display device 10, in the display device 11, the oxide semiconductor layer 140 is located below the first transparent conductive layer 145 in an area where the oxide semiconductor layer 140 and the first transparent conductive layer 145 overlap each other, and the oxide semiconductor layer 140 is not located in an area where the pixel electrode 520 is provided.

The display device 11 shown in FIG. 10 is realized by forming the oxide semiconductor layer 140 and the first transparent conductive layer 145 by etching in separate steps. In the example shown in FIG. 10, the oxide semiconductor layer 140 is not located in the area where the pixel electrode 520 is provided. The display device 11 is not limited to having such a structure. For example, as in the display device 10 shown in FIG. 3, the oxide semiconductor layer 140 may be located in the area where the pixel electrode 520 is provided.

As described above, in the display device 11 in modification 1 of embodiment 1 according to the present invention, the oxide semiconductor layer 140 is not located in the area where the pixel electrode 520 is provided. Therefore, the area where the pixel electrode 520 is provided has improved light transmittance.

Modification 2 of Embodiment 1

Figure 11:
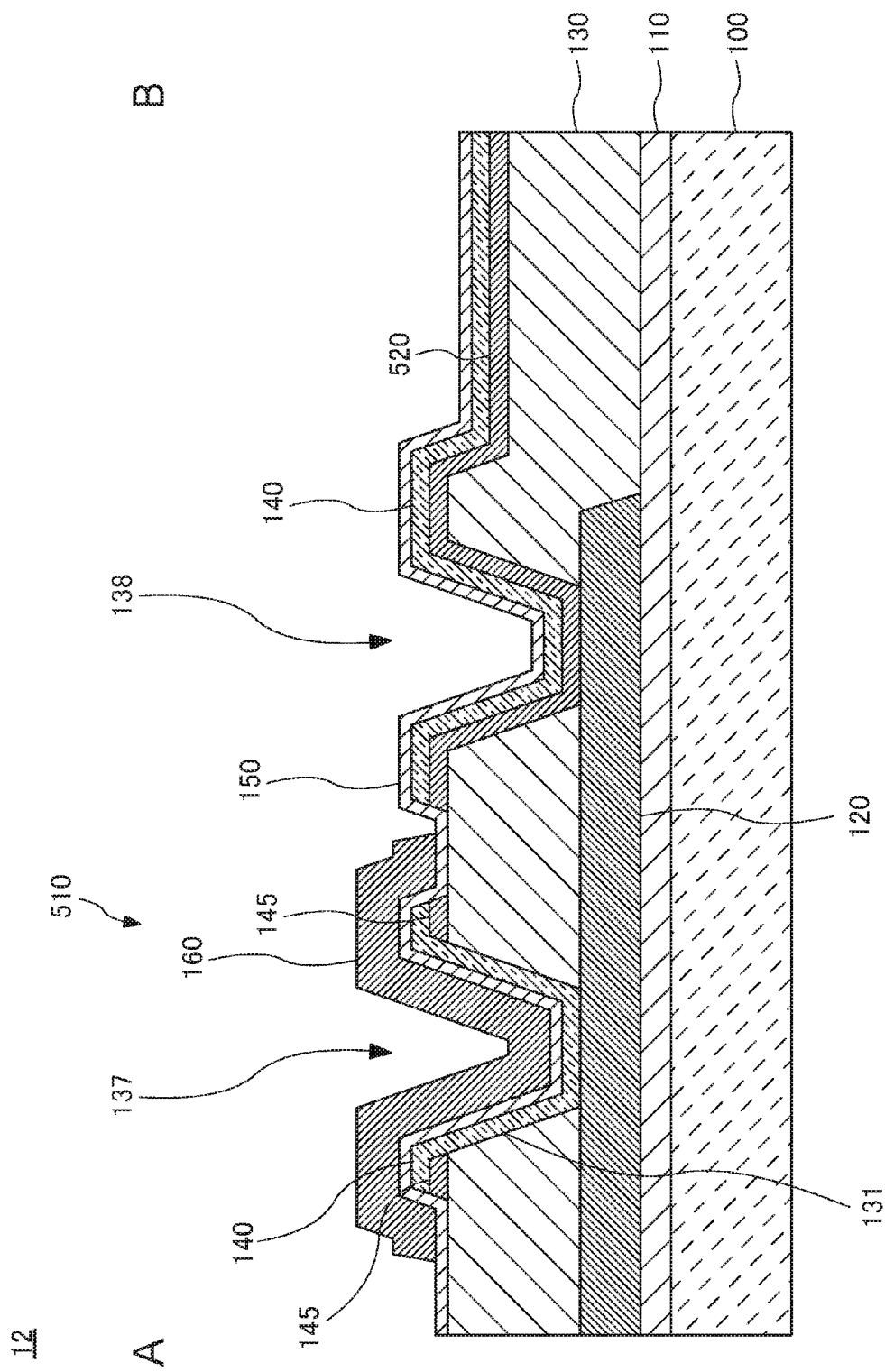
FIG. 11 is a cross-sectional view taken along line A-B in FIG. 2B showing a selective transistor region and a pixel region of a display device in a modification of the embodiment according to the present invention.

With reference to FIG. 11, modification 2 of embodiment 1 according to the present invention will be described. A display device 12 in modification 2 of embodiment 1 is similar to the display device 10 described in embodiment 1. In the following description, the identical component to, or the components having the identical functions to, those of the display device 10 will bear the identical reference numerals thereto, and detailed descriptions thereof will be omitted.

[Structure of the Display Device 12]

FIG. 11 is a cross-sectional view of a selective transistor region and a pixel region of the display device 12 in modification 2 of embodiment 1 according to the present invention. The display device 12 shown in FIG. 11 is similar to the display device 10 shown in FIG. 3. Unlike in the display device 10, in the display device 12, the pixel electrode 520 is connected with the lower electrode 120 of the selective transistor 510 via a second opening 138 formed in the first insulating layer 130, and the first transparent conductive layer 145 of the selective transistor 510 and the pixel electrode 520 are separated from each other.

Namely, in the display device 12, the lower electrode 120 acts as a drain electrode of the selective transistor 510, and the first transparent conductive layer 145 acts as a source electrode of the selective transistor 510. Therefore, the data line 541 forms the same layer with the first transparent conductive layer 145, and the first transparent conductive layer 145 is a part of the data line 541. In the example shown in FIG. 11, the oxide semiconductor layer 140 is located on the pixel electrode 520. The display device 12 is not limited to having such a structure. The oxide semiconductor layer 140 may not be located on the pixel electrode 520. In the example shown in FIG. 11, the data line 541 and the first transparent conductive layer 145 form the same layer. The display device 12 is not limited to having such a structure. The data line 541 may be formed of a conductive layer different from the first transparent conductive layer 145.

As described above, in the display device 12 in modification 2 of embodiment 1 according to the present invention, the pixel electrode 520 is connected with the lower electrode 120 of the selective transistor 510. Therefore, the lower electrode 120, which is the drain electrode of the selective transistor 510, may extend to the vicinity of the pixel electrode 520, which allows the resistance value between the selective transistor 510 and the pixel electrode 520 to be decreased.

Modification 3 of Embodiment 1

Figure 12:
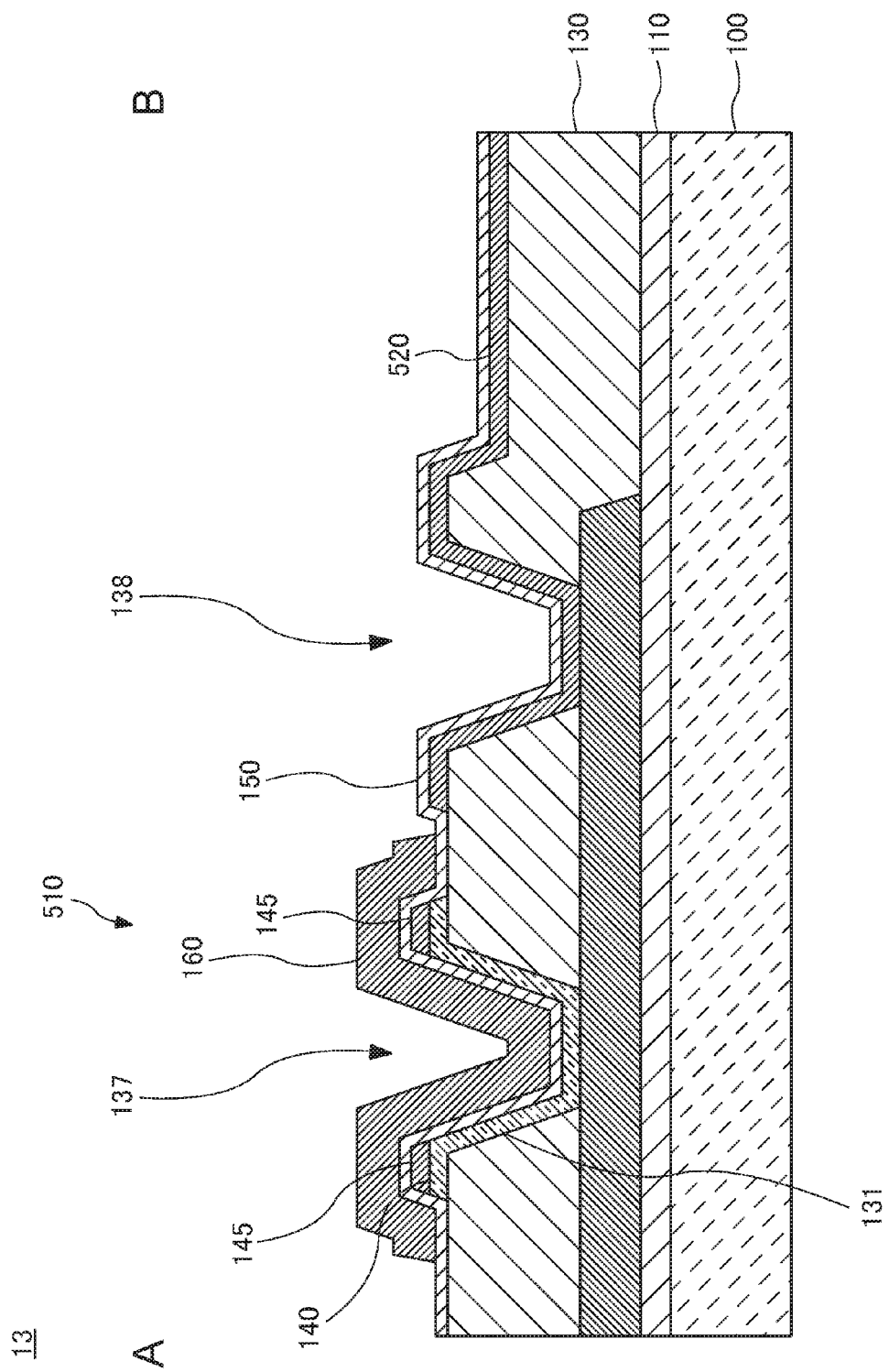
FIG. 12 is a cross-sectional view taken along line A-B in FIG. 2B showing a selective transistor region and a pixel region of a display device in a modification of the embodiment according to the present invention.

With reference to FIG. 12, modification 3 of embodiment 1 according to the present invention will be described. A display device 13 in modification 3 of embodiment 1 is similar to the display device 12 in modification 2 of embodiment 1. In the following description, the identical component to, or the components having the identical functions to, those of the display device 12 will bear the identical reference numerals thereto, and detailed descriptions thereof will be omitted.

[Structure of the Display Device 13]

FIG. 12 is a cross-sectional view of a selective transistor region and a pixel region of the display device 13 in modification 3 of embodiment 1 according to the present invention. The display device 13 shown in FIG. 12 is similar to the display device 12 shown in FIG. 11. Unlike in the display device 12, in the display device 13, the oxide semiconductor layer 140 is located below the first transparent conductive layer 145 in an area where the oxide semiconductor layer 140 and the first transparent conductive layer 145 overlap each other, and the oxide semiconductor layer 140 is not located in an area where the pixel electrode 520 is provided.

The display device 13 shown in FIG. 12 is realized by forming the oxide semiconductor layer 140 and the first transparent conductive layer 145 by etching in separate steps. In the example shown in FIG. 12, the oxide semiconductor layer 140 is not located in the area where the pixel electrode 520 is provided. The display device 13 is not limited to having such a structure. For example, as in the display device 12 shown in FIG. 11, the oxide semiconductor layer 140 may be located in the area where the pixel electrode 520 is provided.

As described above, in the display device 13 in modification 3 of embodiment 1 according to the present invention, the oxide semiconductor layer 140 is not located in the area where the pixel electrode 520 is provided. Therefore, the area where the pixel electrode 520 is provided has improved light transmittance.

Embodiment 2

Figure 13:
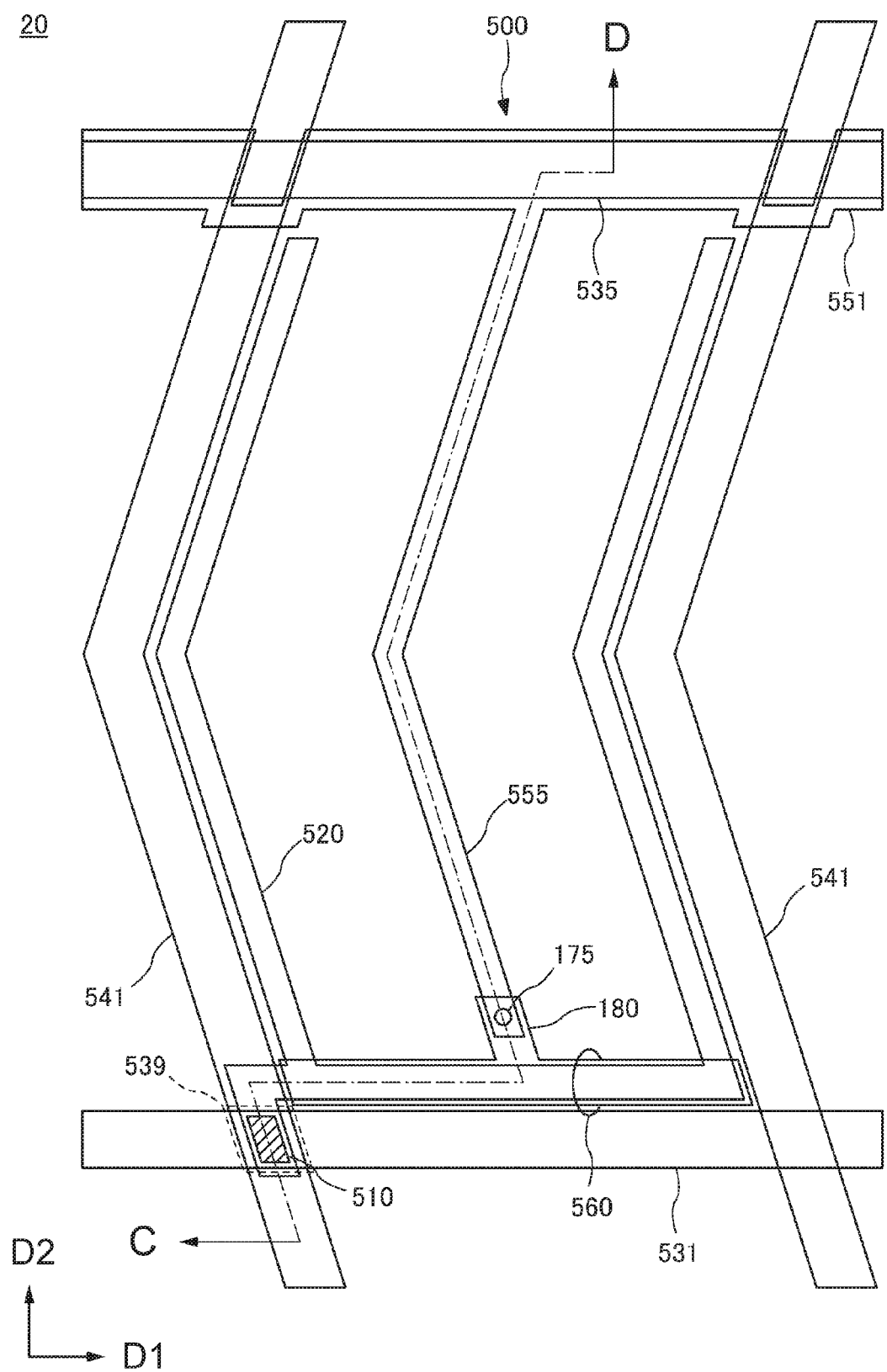
FIG. 13 is a plan view showing a selective transistor region and a pixel region of a display device in an embodiment according to the present invention.
Figure 14:
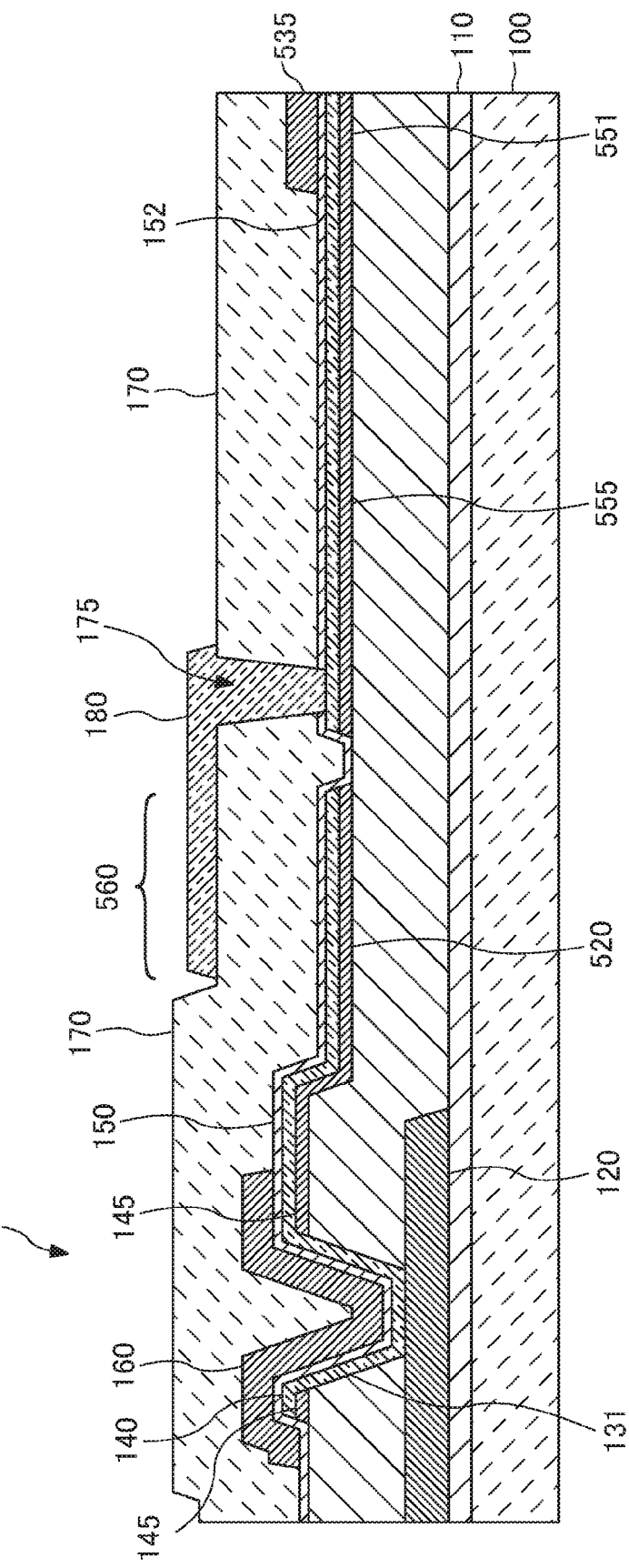
FIG. 14 is a cross-sectional view taken along line C-D in FIG. 13 showing the selective transistor region and the pixel region of the display device in the embodiment according to the present invention.

With reference to FIG. 13 and FIG. 14, a pixel layout and a cross-sectional structure of a display device 20 in embodiment 2 according to the present invention will be described. The display device 20 in embodiment 2 is a liquid crystal display device of a transverse electric field system that includes a transistor array substrate. In embodiment 2, the transistor array substrate of the liquid crystal display device of the transverse electric field system will be described. An overview of the display device 20 is substantially the same as that of embodiment 1, and will not be described.

[Pixel Layout of the Display Device 20]

FIG. 13 is a plan view showing a selective transistor region and a pixel region of the display device 20 in embodiment 2 according to the present invention. As shown in FIG. 13, the pixel 500 includes the gate line 531 extending in the first direction D1, the data line 541 extending, while being bent, in the second direction D2 crossing the first direction D1, the selective transistor 510 located at the crossing point 539 of the gate line 531 and the data line 541, the pixel electrodes 520 connected with the data line 541 via the selective transistor 510, a common electrode 555 located to face the pixel electrodes 520 as seen in a plan view and connected with the common line 551 extending in the first direction D1, and a storage capacitance 560 located in a region where the pixel electrode 520 and the upper electrode 180 overlap each other as seen in a plan view and connected with the selective transistor 510 and the pixel electrode 520.

As shown in FIG. 13, the pixel electrodes 520 and the common electrode 555 extend in the second direction D2 while being bent along the data line 541. The storage capacitance 560 is provided in a region where a part of the pixel electrodes 520 and the upper electrode 180 connected with the common electrode 555 via the third opening 175 overlap each other as seen in a plan view. The common line 551 extends in the first direction D1 so as to avoid the selective transistor 510 located at the crossing point 539.

In the example shown in FIG. 13, two pixel electrodes 520 are located along two adjacent data lines 541, whereas one common electrode 555 is located generally at the middle between the two pixel electrodes 520. The display device 20 is not limited to having such a structure. For example, two common electrodes 555 may be located along two adjacent data lines 541, whereas one pixel electrode 520 may be located generally at the middle between the two common electrodes 555. Still alternatively, either or, both of, the pixel electrode 520 and the common electrode 555 located along the adjacent data lines 541 may be provided in the number of three or greater.

In the example shown in FIG. 13, the data lines 541, the pixel electrodes 520 and the common electrode 555 extend in the second direction D2 while being bent. The display device 20 is not limited to having such a structure. The data lines 541, the pixel electrodes 520 and the common electrode 555 may extend in the second direction D2 in a straight manner. In the example shown in FIG. 13, the storage capacitance 560 is connected with the selective transistor 510 and the pixel electrodes 520. The display device 20 is not limited to having such a structure. For example, the storage capacitance 560 may not be provided as long as the off-current of the selective transistor 510 is sufficiently low to maintain the data signal supplied to the pixel electrode 520 until a data signal of the next frame is supplied.

In the display device 20 shown in FIG. 13, a gate voltage is applied to the gate line 531 to turn the selective transistor 510 on. When a data signal is applied to the data line 541 in the state where the selective transistor 510 is on, the data signal is supplied to the pixel electrode 520 via the selective transistor 510. Meanwhile, the common electrode 555 has a common voltage applied thereto via the common line 551. Namely, in the display device 20, the pixel electrode 520 and the common electrode 555 are supplied with different voltages from each other, and the liquid crystal material is aligned by an electric field, in a transverse direction (direction horizontal to a surface of the substrate 100 on which the selective transistor 510 and the like are provided), generated between the pixel electrode 520 and the common electrode 555. In other words, the pixel electrode 520 and the common electrode 555 are connected with different power sources from each other.

[Structure of the Semiconductor Device 20]

Now, a structure of the selective transistor 510 and the pixel electrode 520 will be described in detail with reference to FIG. 13, which is a plan view, and FIG. 14, which is a cross-sectional view. In the following example, the selective transistor 510 and the pixel electrode 520 in embodiment 2 have substantially the same structure as that of the selective transistor 510 and the pixel electrode 520 in embodiment 1 shown in FIG. 3. Alternatively, the selective transistor 510 and the pixel electrode 520 may have substantially the same structure as that of the selective transistor 510 and the pixel electrode 520 in any of the modifications of embodiment 1. In the following example, the selective transistor 510 in embodiment 2 includes a channel formed of an oxide semiconductor. The selective transistor 510 of the display device 20 in embodiment 2 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like.

FIG. 14 is a cross-sectional view taken along line C-D in FIG. 13 showing the selective transistor region and the pixel region of the display device 20 in embodiment 2 according to the present invention. As shown in FIG. 14, the display device 20 includes, in addition to the selective transistor 510 of the display device 10 shown in FIG. 3, an interlayer insulating layer 170 that is provided on the gate electrode 160 and includes a third opening 175 reaching the oxide semiconductor layer 140 on the common electrode 555, and an upper electrode 180 connected with the common electrode 555 via the third opening 175. As shown in FIG. 14, the common line 551 and the common electrode 555 form the same layer with the first transparent conductive layer 145 and the pixel electrode 520.

In the display device 20, the gate electrode 160 is a part of the gate line 531, and the lower electrode 120 is a part of the data line 541. In other words, the gate electrode 160 is included in the gate line 531, and the lower electrode 120 is included in the data line 541. In still other words, the gate line 531 is connected with the gate electrode 160, and the data line 541 is connected with the lower electrode 120. The selective transistor 510 may be formed in an area in which the gate line 531 and the data line 541 cross each other, namely, in a crossing area including the crossing point 539.

The storage capacitance 560 has the pixel electrode 520 and the upper electrode 180 as a pair of electrodes. The storage capacitance 560 also has, as a dielectric element, the gate insulating layer 150 and the interlayer insulating layer 170 that are located between the pixel electrode 520 and the upper electrode 180. In the example shown in FIG. 14, the electrode of the storage capacitance 560 that faces the pixel electrode 520 forms the same layer with the upper electrode 180, which is located above the gate electrode 160. The display device 20 is not limited to having such a structure. For example, the electrode of the storage capacitance 560 that faces the pixel electrode 520 may form the same layer with the gate electrode 160. Namely, the storage capacitance 560 may have the gate insulating layer 150 as a dielectric element.

A gate line 535 adjacent to the gate line 531 connected with the selective transistor 510 of the pixel 500 is insulated from the common line 551 by an insulating layer 152, which forms the same layer with the gate insulating layer 150.

In the example shown in FIG. 14, the oxide semiconductor layer 140 is located on the common electrode 555. The display device 20 is not limited to having such a structure. The oxide semiconductor layer 140 may not be located on the common electrode 555, and the upper electrode 180 and the common electrode 555 may be in contact with each other.

In the example shown in FIG. 14, the display device 20 realizes a liquid crystal display device of a transverse electric field system using the display device 10 shown in FIG. 3. The display device 20 is not limited to having such a structure. For example, the display device 20 may realize a liquid crystal display device of a transverse electric field system using any of the display devices 11 through 13 shown in FIG. 10 through FIG. 12.

Now, the shapes and the materials of the layers included in the above-described display device 20 will be described in more detail. The substrate 100, the underlying layer 110, the lower electrode 120, the first insulating layer 130, the oxide semiconductor layer 140, the first transparent conductive layer 145, the pixel electrode 520, the gate insulating layer 150, and the gate electrode 160 may be formed of any of substantially the same materials as those described above in embodiment 1 regarding these elements.

The interlayer insulating layer 170 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110, the first insulating layer 130 and the gate insulating layer 150. The interlayer insulating layer 170 may be formed of a thin film, the thickness of which is controllable by a nanometer order, and may be formed by substantially the same method as that of the underlying layer 110. Instead of the above-listed inorganic insulating materials, the interlayer insulating layer 170 may be formed of a TEOS layer or an organic insulating material. The TEOS layer refers to a CVD layer formed of TEOS (Tetra Ethyl Ortho Silicate), and has an effect of alleviating the steps of, and thus flattening, a layer therebelow. Examples of the usable organic insulating material include a polyimide resin, an acrylic resin, an epoxy resin, a silicone resin, a fluorine resin, a siloxane resin, and the like. The interlayer insulating layer 170 may be formed of a single layer or a stack of films of such materials. For example, the interlayer insulating layer 170 may include a stack of an inorganic insulating material and an organic insulating material.

The upper electrode 180 may be formed of any of substantially the same materials as those described above regarding the lower electrode 120 and the gate electrode 160. The upper electrode 180 may be formed of the same material as, or a different material from, that of the lower electrode 120 and the gate electrode 160. Alternatively, the upper electrode 180 may be formed of copper (Cu), silver (Ag), gold (Au), or the like instead of the above-listed materials regarding the lower electrode 120 and the gate electrode 160. The upper electrode 180 may be formed of a thin film, the thickness of which is controllable by a nanometer order. Preferably, the material used for the upper electrode 180 is resistant to a heat treatment in a manufacturing process of a transistor including a channel formed of an oxide semiconductor.

As described above, the display device 20 in embodiment 2 according to the present invention provides substantially the same effect as that of the display device 10 in embodiment 1, and also realizes a liquid crystal display device of a transverse electric field system having a wide viewing angle. In addition, the storage capacitance 560 is formed without increasing the steps of the manufacturing method.

Modification 1 of Embodiment 2

Figure 15:
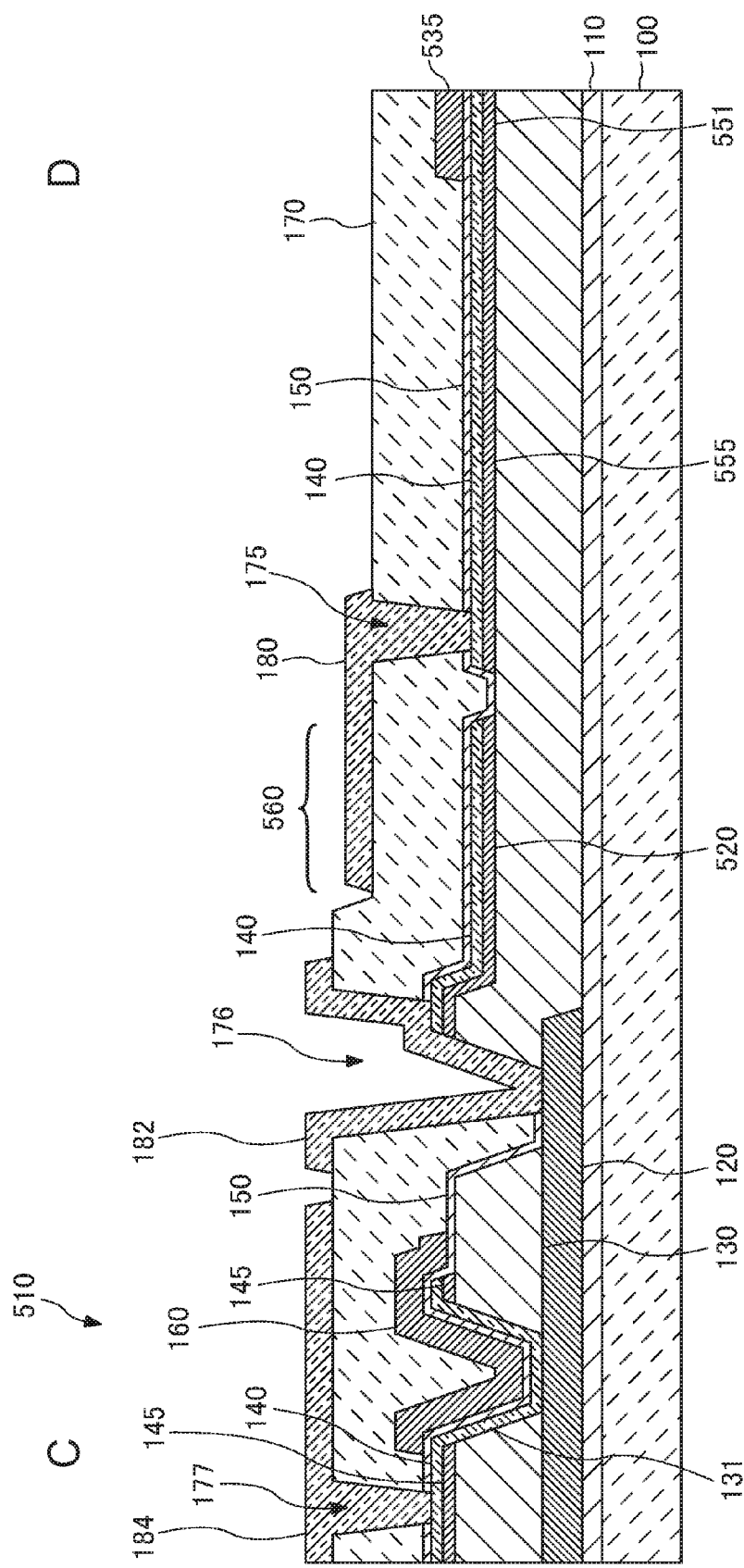
FIG. 15 is a cross-sectional view taken along line C-D in FIG. 13 showing a selective transistor region and a pixel region of a display device in a modification of the embodiment according to the present invention.

With reference to FIG. 15, modification 1 of embodiment 2 according to the present invention will be described. A display device 21 in modification 1 of embodiment 2 is similar to the display device 20 described in embodiment 2. In the following description, the identical component to, or the components having the identical functions to, those of the display device 20 will bear the identical reference numerals thereto, and detailed descriptions thereof will be omitted.

[Structure of the Display Device 21]

FIG. 15 is a cross-sectional view of a selective transistor region and a pixel region of the display device 21 in modification 1 of embodiment 2 according to the present invention. The display device 21 shown in FIG. 15 is similar to the display device 20 shown in FIG. 14. Unlike the display device 20, the display device 21 includes an upper electrode 184 connected with the oxide semiconductor layer 140, an upper electrode 182 connecting the lower electrode 120 and the pixel electrode 520 with each other, and the interlayer insulating layer 170 located between the oxide semiconductor layer 140 and the upper electrode 184.

This will be described in more detail. Unlike in the display device 20, in the display device 21, the upper electrode 184 is connected with the oxide semiconductor layer 140 located on the first insulating layer 130 via a fifth opening 177 formed in the interlayer insulating layer 170, the upper electrode 182 connects the pixel electrode 520 and the lower electrode 120 of the selective transistor 510 with each other via a fourth opening 176 formed in the first insulating layer 130 and the interlayer insulating layer 170, and the first transparent conductive layer 145 of the selective transistor 510 and the pixel electrode 520 are separated from each other.

Although not shown explicitly in FIG. 15, unlike in the display device 20 shown in FIG. 14, in the display device 21, the upper electrode 184 is a part of the data line 541. Namely, the data line 541 is connected with the first transparent conductive layer 145 via the upper electrode 184. In the display device 21, the lower electrode 120 acts as a drain electrode of the selective transistor 510, and the first transparent conductive layer 145 acts as a source electrode of the selective transistor 510.

In the example shown in FIG. 15, the upper electrode 184 and the oxide semiconductor layer 140 are in contact with each other. The display device 21 is not limited to having such a structure. For example, the fifth opening 177 may reach the first transparent conductive layer 145, so that the upper electrode 184 and the first transparent conductive layer 145 may be in contact with each other. Similarly, the fourth opening 176 may reach the pixel electrode 520, so that the upper electrode 182 may be in contact with a top surface of the pixel electrode 520 that is exposed by the fourth opening 176. In the example shown in FIG. 15, the oxide semiconductor layer 140 is located on the pixel electrode 520 and on the common electrode 555. The display device 21 is not limited to having such a structure. The oxide semiconductor layer 140 may not be located on the pixel electrode 520 or the common electrode 555.

As described above, in the display device 21 in modification 1 of embodiment 2 according to the present invention, the pixel electrode 520 is connected with the lower electrode 120 of the selective transistor 510. Therefore, the lower electrode 120, which is the drain electrode of the selective transistor 510, and the pixel electrode 520, are connected with each other via a line forming the same layer with the lower electrode 120. Since the lower electrode 120 may be formed of a metal material having a resistance lower than that of the transparent conductive layer, this structure allows the resistance value between the selective transistor 510 and the pixel electrode 520 to be decreased.

[Manufacturing Method of the Display Device 21]

With reference to cross-sectional views provided in FIG. 16 through FIG. 20, a manufacturing method of the display device 21 in modification 1 of embodiment 2 according to the present invention will be described.

Figure 16:
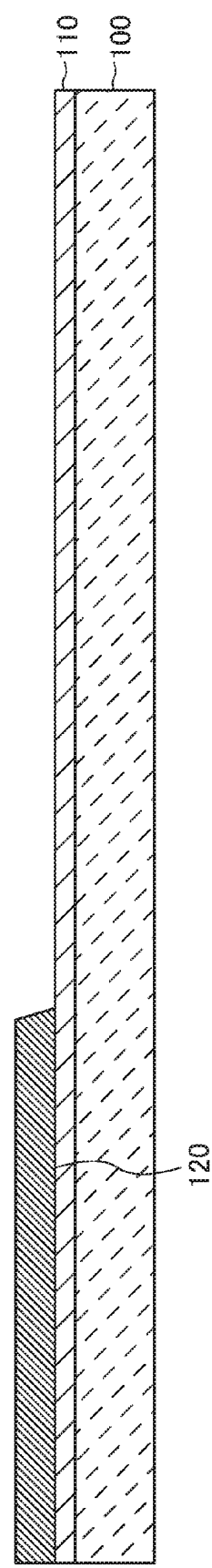
FIG. 16 is a cross-sectional view showing a step of forming an underlying layer and a lower electrode on a substrate in a manufacturing method of the display device in the modification of the embodiment according to the present invention.

FIG. 16 is a cross-sectional view showing a step of forming the underlying layer 110 and the lower electrode 120 on the substrate 100 in the manufacturing method of the display device 21 in modification 1 of embodiment 2 according to the present invention. Referring to FIG. 16, the underlying layer 110 and a film for the lower electrode 120 are formed on the substrate 100, and patterning is performed by photolithography and etching to form the lower electrode 120 (and the data line 541). Preferably, the etching is performed to form the lower electrode 120 under the condition that the etching rate ratio of the lower electrode 120 with respect to the underlying layer 110 is high.

Figure 17:
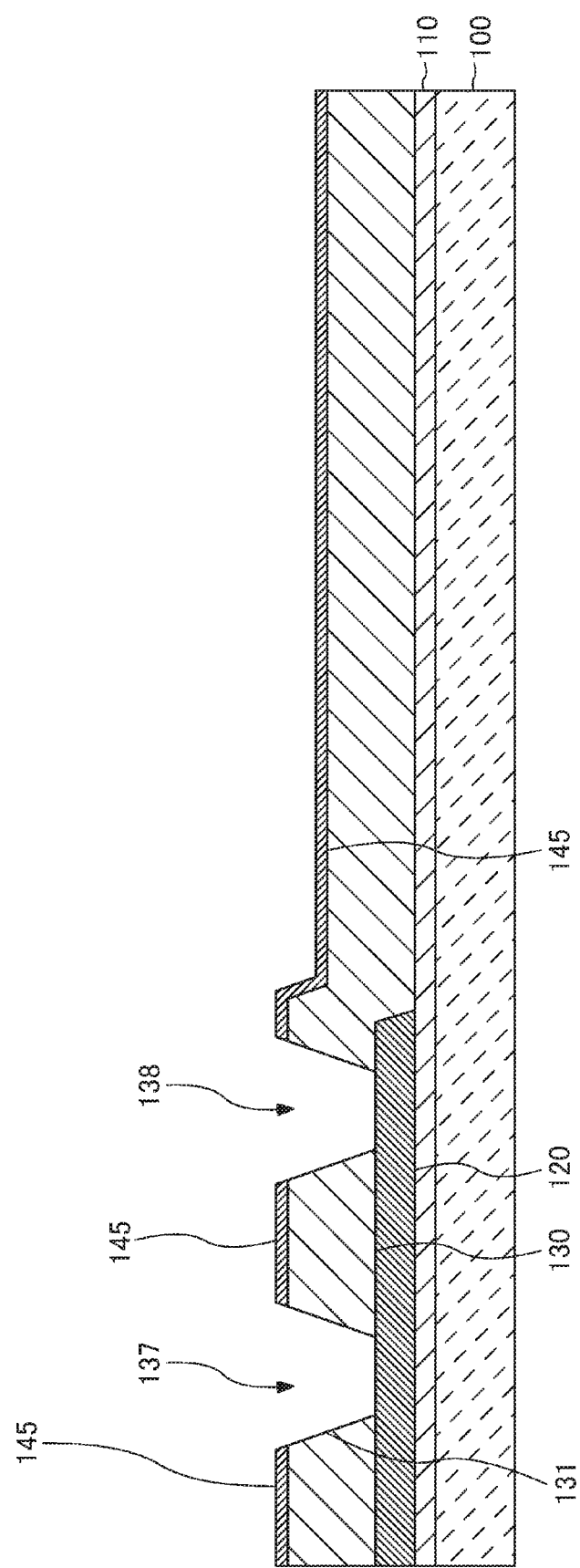
FIG. 17 is a cross-sectional view showing a step of forming a first insulating layer and a first transparent conductive layer in the manufacturing method of the display device in the modification of the embodiment according to the present invention.

FIG. 17 is a cross-sectional view showing a step of forming the first insulating layer 130 and the first transparent conductive layer 145 in the manufacturing method of the display device 21 in modification 1 of embodiment 2 according to the present invention. Referring to FIG. 17, a film for the first insulating layer 130 and a film for the first transparent conductive layer 145 are formed on the entirety of the substrate shown in FIG. 16, more specifically, on the lower electrode 120 and the underlying layer 110; and patterning is performed by photolithography and etching to form the first opening 137 and the second opening 138. The first insulating layer 130 and the first transparent conductive layer 145 may be processed by substantially the same method as in embodiment 1.

Preferably, the etching is performed to form the first insulating layer 130 under the condition that the etching rate ratio of the first insulating layer 130 with respect to the lower electrode 120 is high. In the case where the first opening 137 or the second opening 138 reach the lower electrode 120 and the underlying layer 110, the etching is preferably performed to form the first insulating layer 130 under the condition that the etching rate ratio of the first insulating layer 130 with respect to both of the lower electrode 120 and the underlying layer 110 is high. In the case where it is difficult to guarantee a high etching rate ratio of the first insulating layer 130 with respect to the underlying layer 110, for example, in the case where the first insulating layer 130 and the underlying layer 110 are formed of the same material, an etching stopper layer may be formed on the underlying layer 110. The first opening 137 and the second opening 138 may be square, or any of various shapes, for example, circular, elliptical, polygonal, curved or the like.

Figure 18:
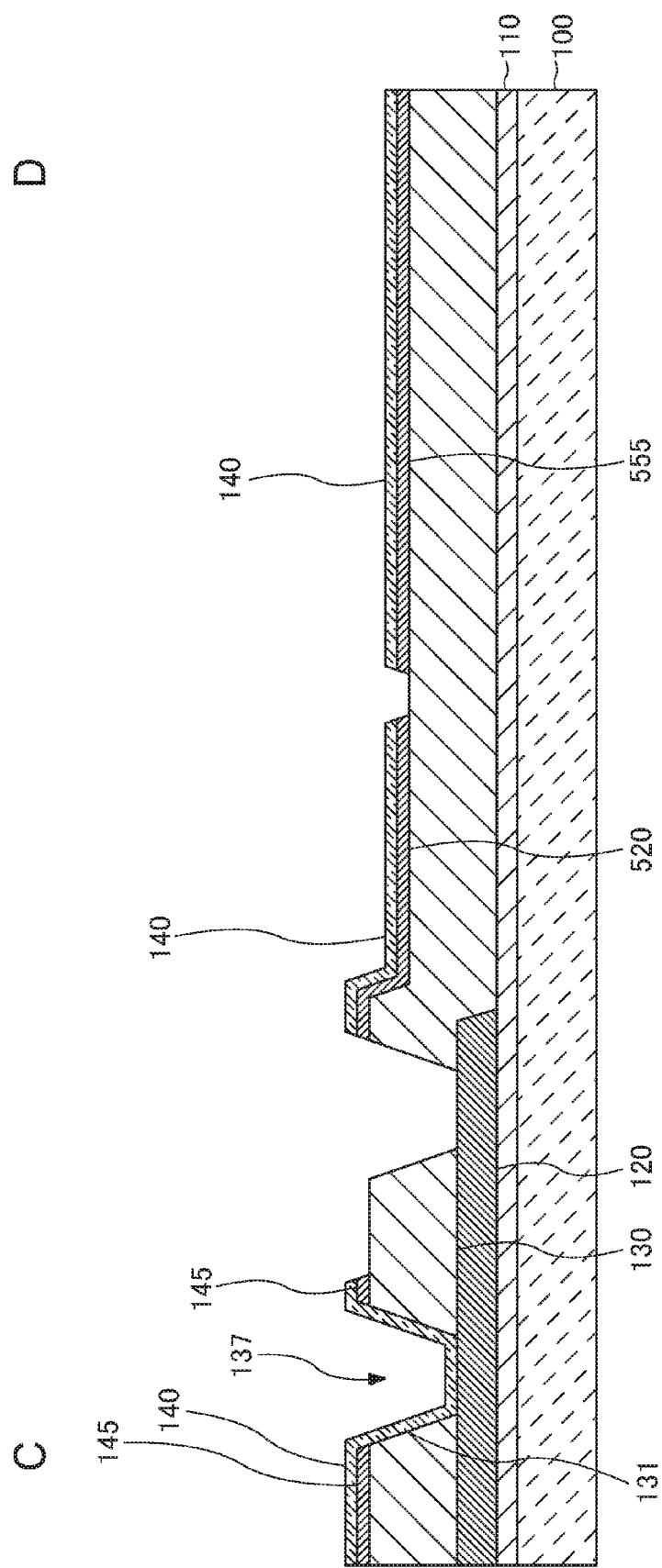
FIG. 18 is a cross-sectional view showing a step of forming an oxide semiconductor layer in the manufacturing method of the display device in the modification of the embodiment according to the present invention.

FIG. 18 is a cross-sectional view showing a step of forming the oxide semiconductor layer 140 in the manufacturing method of the display device 21 in modification 1 of embodiment 2 according to the present invention. Referring to FIG. 18, a film for the oxide semiconductor layer 140 is formed on the entirety of the substrate shown in FIG. 17, and patterning is performed by photolithography and etching to form the oxide semiconductor layer 140 as shown in FIG. 18. The etching performed to form the oxide semiconductor layer 140 may be sputtering. It is sufficient that the oxide semiconductor layer 140 is formed to cover at least the first side wall 131 provided in a ring shape along an inner circumferential surface of the first opening 137 formed in the first insulating layer 130.

When the oxide semiconductor layer 140 is formed by etching, the first transparent conductive layer 145 provided below the oxide semiconductor layer 140 is also etched. Such etching allows the pixel electrode 520 and the common electrode 555 to be formed by patterning as shown in FIG. 18 in the step of forming the oxide semiconductor layer 140 by patterning. The etching performed to form the oxide semiconductor layer 140, the first transparent conductive layer 145, the pixel electrode 520 and the common electrode 555 may be dry etching or wet etching. In the case where the oxide semiconductor layer 140, the first transparent conductive layer 145, the pixel electrode 520 and the common electrode 555 are formed by wet etching, an etchant containing oxalic acid may be used.

Figure 19:
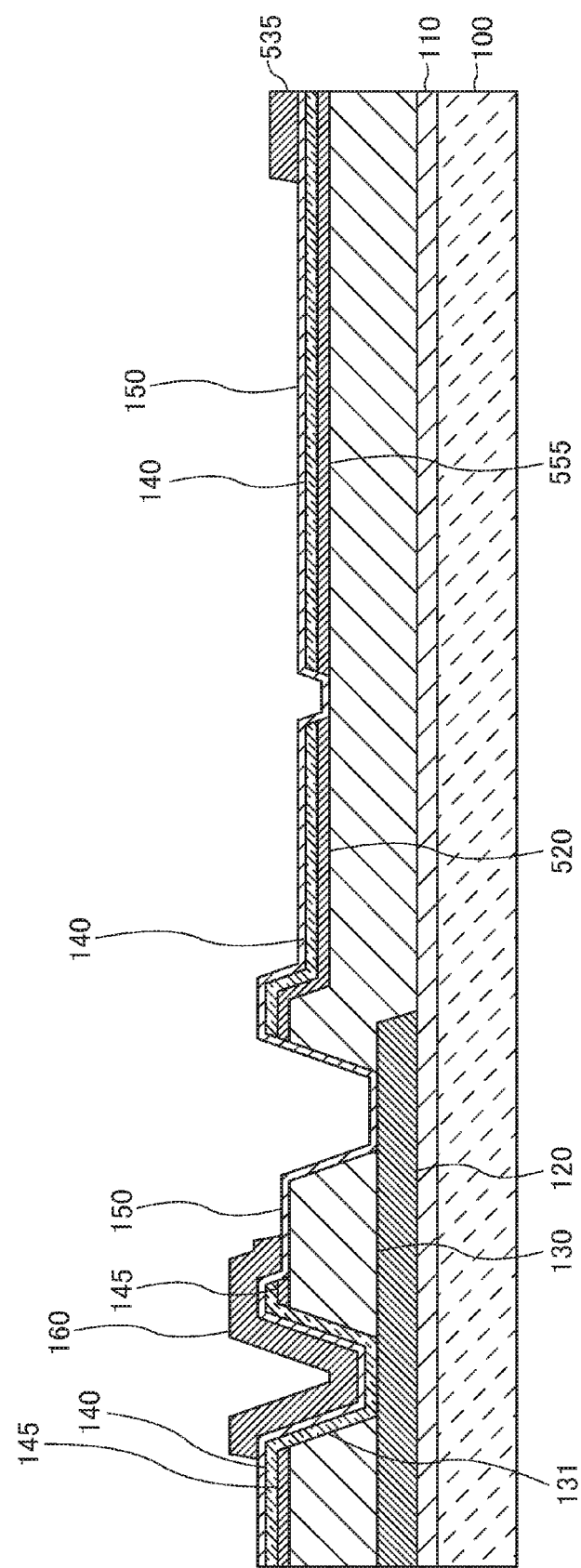
FIG. 19 is a cross-sectional view showing a step of forming a gate insulating layer and a gate electrode in the manufacturing method of the display device in the modification of the embodiment according to the present invention.

FIG. 19 is a cross-sectional view showing a step of forming the gate insulating layer 150 and the gate electrode 160 in the manufacturing method of the display device 21 in modification 1 of embodiment 2 according to the present invention. Referring to FIG. 19, the gate insulating layer 150 and a film for the gate electrode 160 are formed on the entirety of the substrate shown in FIG. 18, and patterning is performed by photolithography and etching to form the gate electrode 160. Although not shown, the gate electrode 160 is located to cover the ring-shaped first side wall 131 as seen in a plan view. In the example shown in FIG. 19, the gate insulating layer 150 acts as an etching stopper layer to form the gate electrode 160, so that only the gate electrode 160 is formed by etching. Alternatively, the gate insulating layer 150 and the gate electrode 160 may be formed together by etching.

Figure 20:
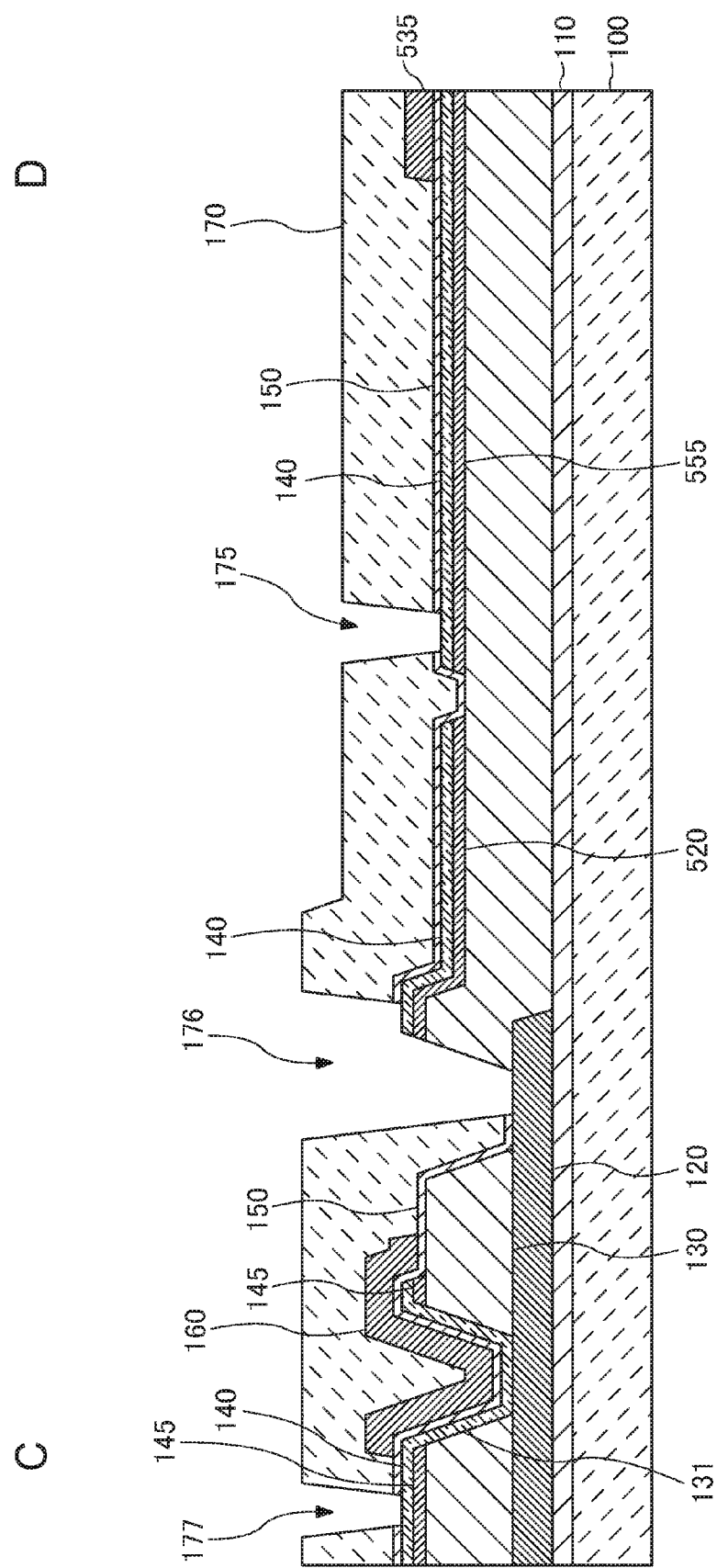
FIG. 20 is a cross-sectional view showing a step of forming an interlayer insulating layer and also forming an opening in the interlayer insulating layer and the gate insulating layer in the manufacturing method of the display device in the modification of the embodiment according to the present invention.

FIG. 20 is a cross-sectional view showing a step of forming the interlayer insulating layer 170 and also forming the openings 175, 176 and 177 in the interlayer insulating layer 170 and the gate insulating layer 150 in the manufacturing method of the display device 21 in modification 1 of embodiment 2 according to the present invention. Referring to FIG. 20, the interlayer insulating layer 170 is formed on the entirety of the substrate shown in FIG. 19, and patterning is performed by photolithography and etching to form the third opening 175, the fourth opening 176 and the fifth opening 177 as shown in FIG. 20. In the example shown in FIG. 20, the oxide semiconductor layer 140 is used as an etching stopper layer to form the third opening 175 and the fifth opening 177. The display device 21 is not limited to being manufactured by such a method. For example, the oxide semiconductor layer 140 may be etched to expose the first transparent conductive layer 145, the pixel electrode 520 and the common electrode 555, and thus to form the third opening 175, the fourth opening 176 and the fifth opening 177.

Then, a film for the upper electrodes 180, 182 and 184 is formed on the entirety of the substrate shown in FIG. 20, and patterning is performed as shown in FIG. 15 to form the upper electrodes 180, 182 and 184. The display device 21 shown in FIG. 15 in modification 1 of embodiment 2 according to the present invention is manufactured by the manufacturing method described above. Referring to FIG. 15, the portion of the oxide semiconductor layer 140 that is located on the first side wall 131 is the channel region 141. Namely, the channel region 141 of the selective transistor 510 is formed in a ring shape along the first side wall 131, and is of a surround type which does not include the end of the oxide semiconductor layer 140.

As described above, according to the manufacturing method of the display device 21 in modification 1 of embodiment 2 of the present invention, the first insulating layer 130 and the first transparent conductive layer 145 are formed at the same time by etching, and the first transparent conductive layer 145 and the oxide semiconductor layer 140 are formed at the same time by etching. Therefore, the step of forming the first transparent conductive layer 145 by etching does not need to be provided separately, which allows the display device 21 to be manufactured with a smaller number of steps. This improves the productivity and decreases the production cost. In addition, the lower electrode 120 and the pixel electrode 520 are exposed to the fourth opening 176, and the lower electrode 120 and the pixel electrode 520 are connected with each other via the upper electrode 182. This allows the display device 21 to be manufactured with a still smaller number of steps.

Embodiment 3

Figure 21:
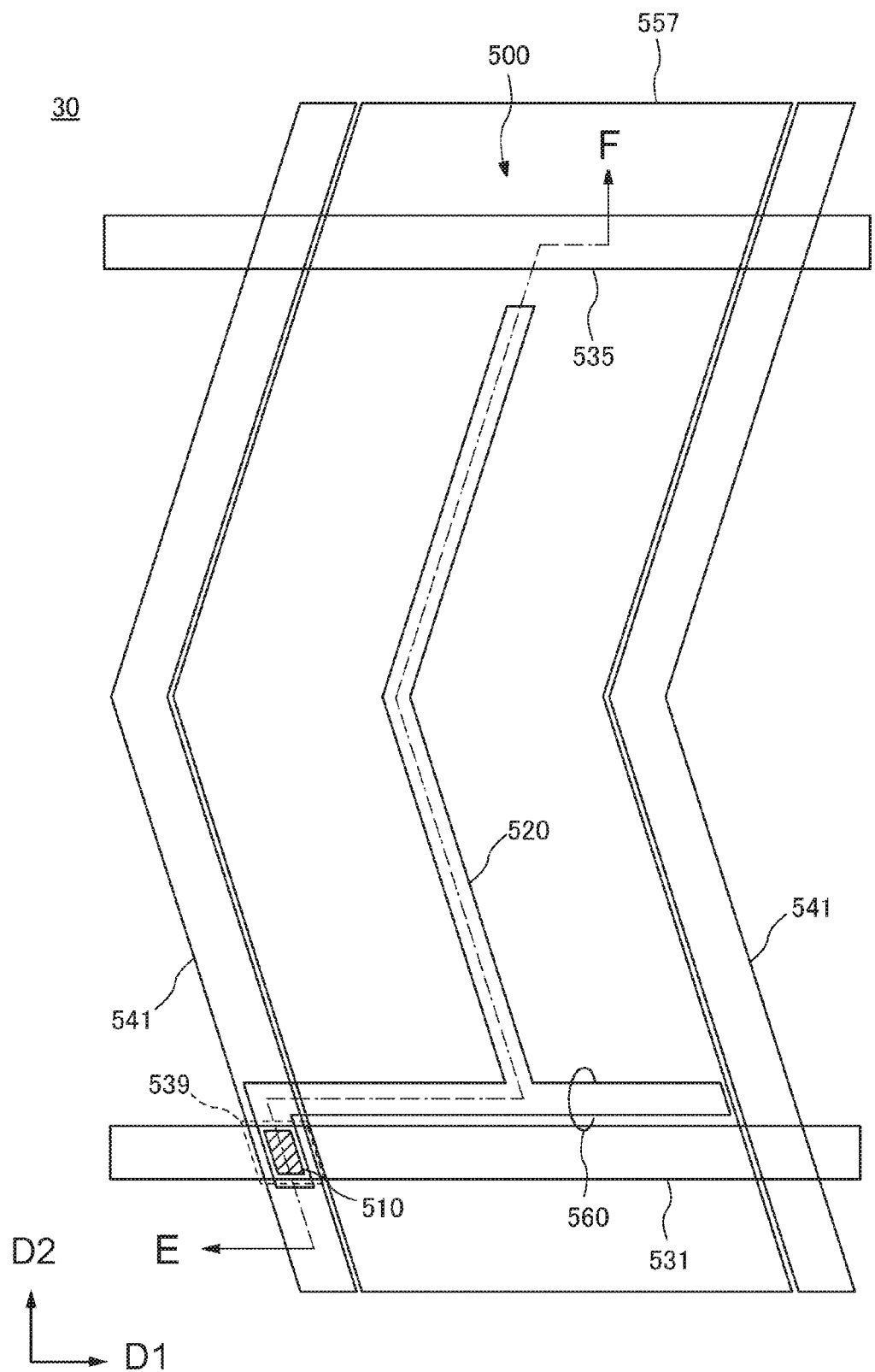
FIG. 21 is a plan view showing a selective transistor region and a pixel region of a display device in an embodiment according to the present invention.
Figure 22:
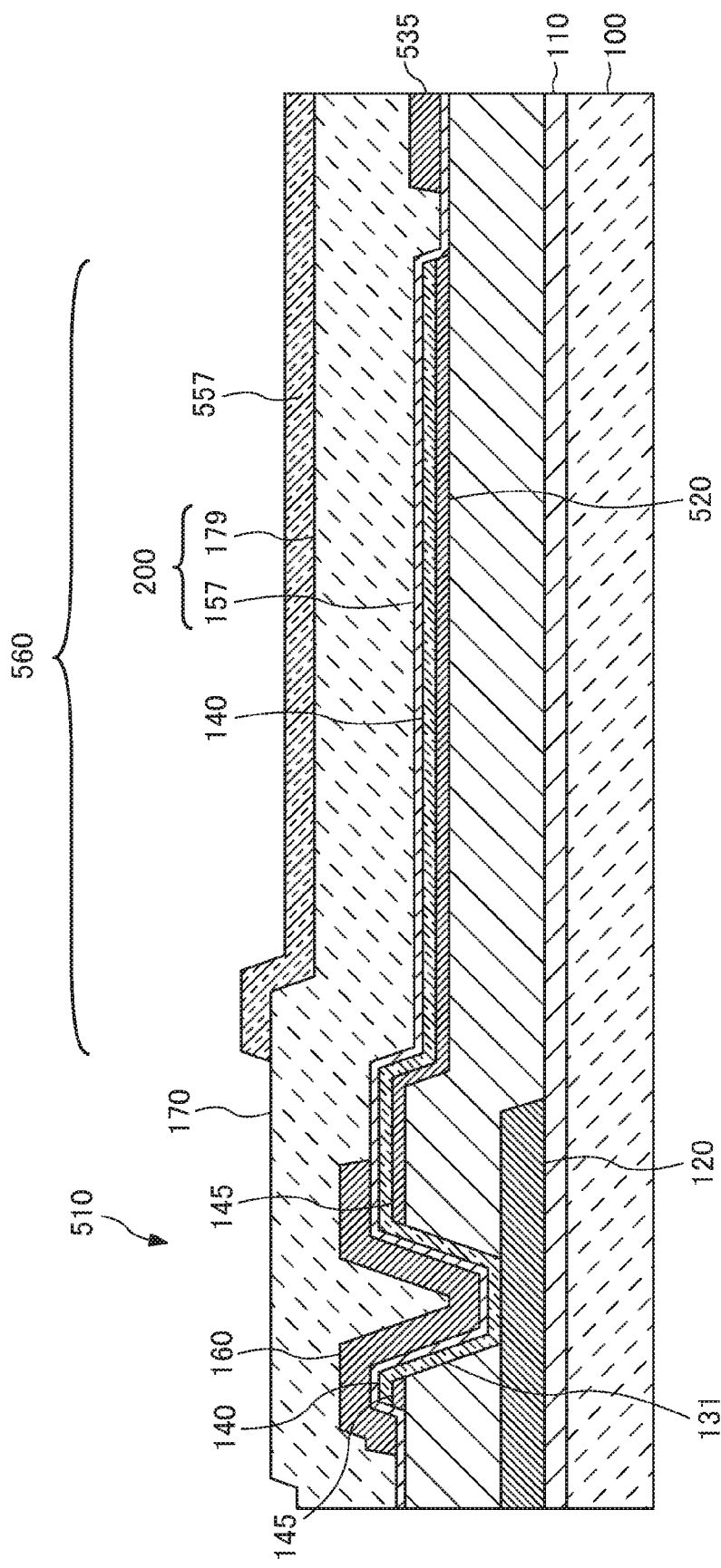
FIG. 22 is a cross-sectional view taken along line E-F in FIG. 21 showing the selective transistor region and the pixel region of the display device in the embodiment according to the present invention.

With reference to FIG. 21 and FIG. 22, a pixel layout and a cross-sectional structure of a display device 30 in embodiment 3 according to the present invention will be described. The display device 30 in embodiment 3 is a liquid crystal display device of a transverse electric field system that includes a transistor array substrate. In embodiment 3, the transistor array substrate of the liquid crystal display device of the transverse electric field system will be described. An overview of the display device 30 is substantially the same as that of embodiment 1, and will not be described.

[Pixel Layout of the Display Device 30]

FIG. 21 is a plan view showing a selective transistor region and a pixel region of the display device 30 in embodiment 3 according to the present invention. As shown in FIG. 21, the pixel 500 includes the gate line 531 extending in the first direction D1, the data line 541 extending, while being bent, in the second direction D2 crossing the first direction D1, the selective transistor 510 located at the crossing point 539 of the gate line 531 and the data line 541, the pixel electrode 520 connected with the data line 541 via the selective transistor 510, a common electrode 557 extending in the second direction D2 while being bent along the data line 541 and located in substantially the entirety of the pixel 500 so as to overlap the pixel electrode 520 as seen in a plan view, and the storage capacitance 560 located in a region where the pixel electrode 520 and the common electrode 557 overlap each other as seen in a plan view and connected with the selective transistor 510 and the pixel electrode 520.

The common electrode 557 is provided commonly for the pixels 500 adjacent to each other in the second direction D2 among the pixels 500 located in a matrix. In the example shown in FIG. 21, the common electrode 557 is located in substantially the entirety of the pixel 500 as seen in a plan view so as to overlap the pixel electrode 520. The display device 300 is not limited to having such a structure. For example, like the pattern of the pixel electrodes 520 and the common electrode 555 of the display device 20 shown in FIG. 13, two common electrodes 557 may extend in the second direction D2 along the data lines 541 that are adjacent to each other so as to have, therebetween, the pixel electrode 520, extending in the second direction D2 while being bent.

Namely, it is sufficient that the common electrode 557 is located in a different region from that of at least the pixel electrode 520 as seen in a plan view such that a transverse electric field is generated in the pixel 500. In order to form the storage capacitance 560, the common electrode 557 and the pixel electrode 520 may partially overlap each other as seen in a plan view.

As shown in FIG. 21, the pixel electrode 520 is located generally at the middle between the data lines 541 adjacent to each other, and extend, while being bent, in the second direction 2 along the adjacent data lines 541. In the example shown in FIG. 21, one pixel electrode 520 is located along the adjacent data lines 541. Two or more pixel electrodes 520 may be located along the adjacent data lines 541.

In the example shown in FIG. 21, the data lines 541, the pixel electrode 520 and the common electrode 557 extend, while being bent, in the second direction D2. The display device 30 is not limited to having such a structure. The data lines 541, the pixel electrode 520 and the common electrode 557 may extend in the second direction D2 in a straight manner. In the example shown in FIG. 21, the storage capacitance 560 is connected with the selective transistor 510 and the pixel electrodes 520. The display device 30 is not limited to having such a structure. For example, the storage capacitance 560 may not be provided as long as the off-current of the selective transistor 510 is sufficiently low to maintain the data signal supplied to the pixel electrode 520 until a data signal of the next frame is supplied.

In the display device 30 shown in FIG. 21, like in the display device 20 shown in FIG. 13, the data signal is supplied to the pixel electrode 520 via the selective transistor 510. Meanwhile, the common electrode 557 has a common voltage applied thereto. Namely, the liquid crystal material is aligned by an electric field, in a transverse direction (direction horizontal to a surface of the substrate 100 on which the selective transistor 510 and the like are provided), generated between the pixel electrode 520 and the common electrode 557 in a region where the pixel electrode 520 and the common electrode 557 do not overlap each other as seen in a plan view.

[Structure of the Semiconductor Device 30]

Now, a structure of the selective transistor 510 and the pixel electrode 520 will be described in detail with reference to FIG. 21, which is a plan view, and FIG. 22, which is a cross-sectional view. In the following example, the selective transistor 510 and the pixel electrode 520 in embodiment 3 have substantially the same structure as that of the selective transistor 510 and the pixel electrode 520 in embodiment 1 shown in FIG. 3. Alternatively, the selective transistor 510 and the pixel electrode 520 may have substantially the same structure as that of the selective transistor 510 and the pixel electrode 520 in any of the modifications of embodiment 1. In the following example, the selective transistor 510 in embodiment 3 includes a channel formed of an oxide semiconductor. The display device 30 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like.

FIG. 22 is a cross-sectional view taken along line E-F in FIG. 21 showing the selective transistor region and the pixel region of the display device 30 in embodiment 3 according to the present invention. The structure of the selective transistor 510 shown in FIG. 22 is the same as that of the selective transistor 510 of the display device 10 in embodiment 1 shown in FIG. 3, and will not be described. The display device 30 shown in FIG. 22 is similar to the display device 20 shown in FIG. 14. In the display device 30 show in FIG. 22, unlike in the display device 20, the common electrode 557 forms a layer different from the layer of the first transparent conductive layer 145 and the pixel electrode 520. A gate insulating layer 157 and an interlayer insulating layer 179 are located between the pixel electrode 520 and the common electrode 557 that overlap each other as seen in a plan view.

The insulating layers located between the pixel electrode 520 and the common electrode 557 (i.e., the gate insulating layer 157 and the interlayer insulating layer 179) will be collectively referred to as a second insulating layer 200. The storage capacitance 560 of the display device 30 has the pixel electrode 520 and the common electrode 557 as a pair of electrodes and also has the second insulating layer 200 as a dielectric element.

In the example shown in FIG. 22, the second insulating layer 200 includes the gate insulating layer 157 and the interlayer insulating layer 179. The display device 30 is not limited to having such a structure. For example, the second insulating layer 200 may be either the gate insulating layer 157 or the interlayer insulating layer 179. The second insulating layer 200 may include a layer located between a layer forming the same layer with the first transparent conductive layer 145 and the pixel electrode 520 and a layer forming the same layer with the common electrode 557. For example, the second insulating layer 200 may include a layer forming the same layer with the first insulating layer 130 in addition to the gate insulating layer 157 and the interlayer insulating layer 179.

The gate line 535 adjacent to the gate line 531 connected with the selective transistor 510 of the pixel 500 is insulated from the common electrode 557 by the interlayer insulating layer 179, which forms the same layer with the interlayer insulating layer 170 of the selective transistor 510.

In the example shown in FIG. 22, the oxide semiconductor layer 140 is located on the pixel electrode 520. The display device 30 is not limited to having such a structure. The oxide semiconductor layer 140 may not be located on the pixel electrode 520.

As described above, the display device 30 in embodiment 3 according to the present invention provides substantially the same effect as that of the display device 10 in embodiment 1, and also realizes a liquid crystal display device of a transverse electric field system having a wide viewing angle. In addition, the storage capacitance 560 is formed without increasing the steps of the manufacturing method. Since the common electrode 557 is located in substantially the entirety of the pixel 500 as seen in a plan view and is provided commonly for the pixels 500 adjacent to each other in the column direction, the resistance of the common wiring line 550 is decreased. This suppresses signal delay in the driving of the circuits provided for the pixel 500.

Modification 1 of Embodiment 3

Figure 23:
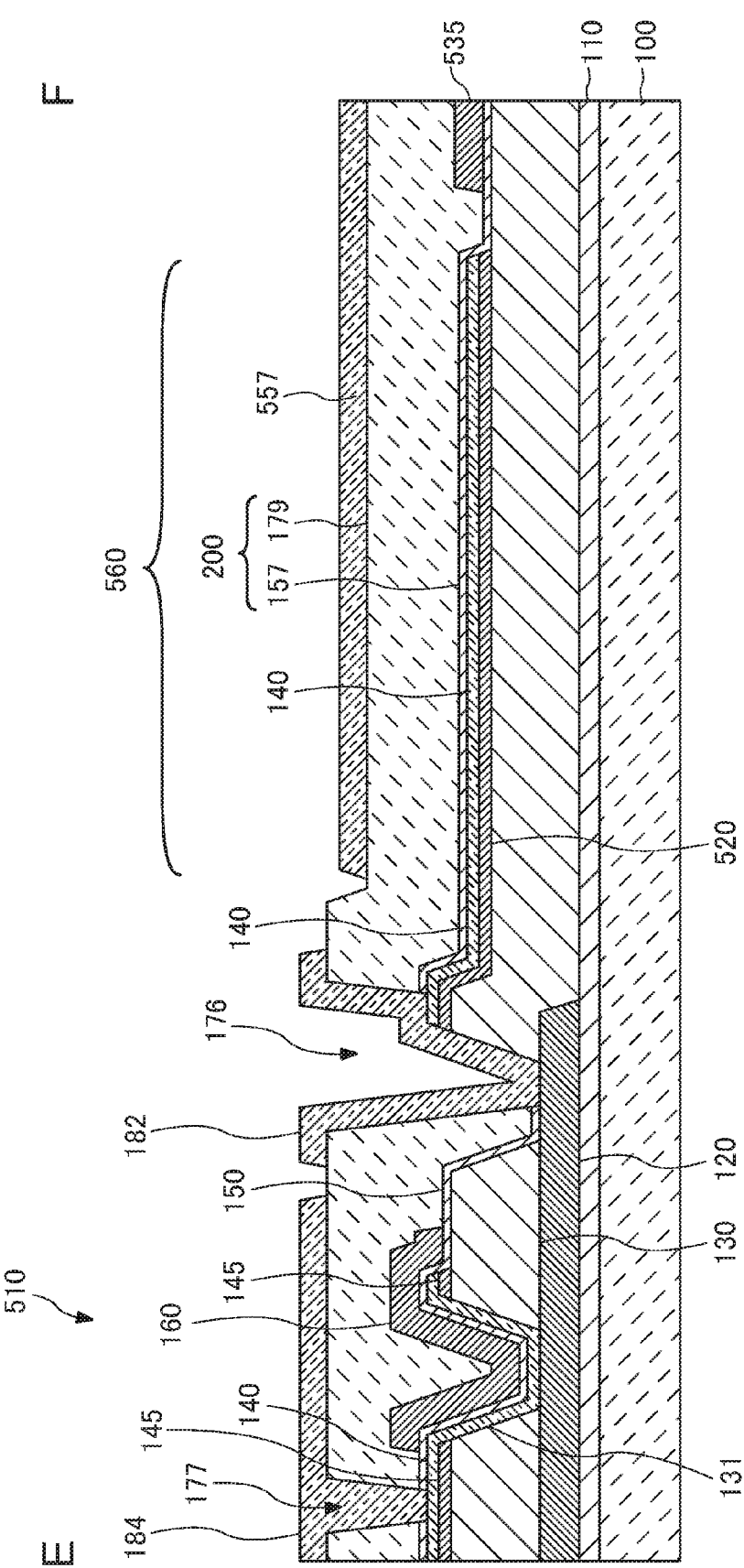
FIG. 23 is a cross-sectional view taken along line E-F in FIG. 21 showing a selective transistor region and a pixel region of a display device in a modification of the embodiment according to the present invention.

With reference to FIG. 23, modification 1 of embodiment 3 according to the present invention will be described. A display device 31 in modification 1 of embodiment 3 is similar to the display device 30 described in embodiment 3. In the following description, the identical component to, or the components having the identical functions to, those of the display device 30 will bear the identical reference numerals thereto, and detailed descriptions thereof will be omitted.

[Structure of the Display Device 31]

FIG. 23 is a cross-sectional view of a selective transistor region and a pixel region of the display device 31 in modification 1 of embodiment 3 according to the present invention. The display device 31 shown in FIG. 23 is similar to the display device 30 shown in FIG. 22. Unlike in the display device 30, in the display device 31, the upper electrode 184 is connected with the oxide semiconductor layer 140 located on the first insulating layer 130 via the fifth opening 177 formed in the interlayer insulating layer 170, the upper electrode 182 connects the pixel electrode 520 and the lower electrode 120 of the selective transistor 510 with each other via the fourth opening 176 formed in the first insulating layer 130 and the interlayer insulating layer 170, and the first transparent conductive layer 145 of the selective transistor 510 and the pixel electrode 520 are separated from each other.

Although not shown explicitly in FIG. 23, unlike in the display device 30 shown in FIG. 22, in the display device 31, the upper electrode 184 is a part of the data line 541. Namely, the data line 541 is connected with the first transparent conductive layer 145 via the upper electrode 184. In the display device 31, the lower electrode 120 acts as a drain electrode of the selective transistor 510, and the first transparent conductive layer 145 acts as a source electrode of the selective transistor 510.

In the example shown in FIG. 23, the upper electrode 184 and the oxide semiconductor layer 140 are in contact with each other. The display device 31 is not limited to having such a structure. For example, the fifth opening 177 may reach the first transparent conductive layer 145, so that the upper electrode 184 and the first transparent conductive layer 145 may be in contact with each other. Similarly, the fourth opening 176 may reach the pixel electrode 520, so that the upper electrode 182 may be in contact with a top surface of the pixel electrode 520 that is exposed by the fourth opening 176. In the example shown in FIG. 23, the oxide semiconductor layer 140 is located on the pixel electrode 520. The display device 31 is not limited to having such a structure. The oxide semiconductor layer 140 may not be located on the pixel electrode 520.

As described above, in the display device 31 in modification 1 of embodiment 3 according to the present invention, the pixel electrode 520 is connected with the lower electrode 120 of the selective transistor 510. Therefore, the lower electrode 120, which is the drain electrode of the selective transistor 510, and the pixel electrode 520, are connected with each other via a line forming the same layer with the lower electrode 120. Since the lower electrode 120 may be formed of a metal material having a resistance lower than that of the transparent conductive layer, this structure allows the resistance value between the selective transistor 510 and the pixel electrode 520 to be decreased.

The present invention is not limited to any of the above-described embodiments, and the embodiments may be modified appropriately without departing from the gist of the present invention.

What is claimed is:

1. A display device, comprising:
    a first electrode;
    a first insulating layer having a first top surface and a first side wall, the first side wall having a closed shape and being exposed to a first opening reaching the first electrode;
    an oxide semiconductor layer on the first side wall, the oxide semiconductor layer including a first portion and a second portion, the first portion being connected with the first electrode;
    a gate electrode facing the oxide semiconductor layer;
    a gate insulating layer between the oxide semiconductor layer and the gate electrode;
    a first transparent conductive layer above the first top surface, the first transparent conductive layer being connected with the second portion; and
    a second transparent conductive layer connected with the first transparent conductive layer, the second transparent conductive layer forming the same layer with the first transparent conductive layer.

2. The display device according to claim 1, wherein the second transparent conductive layer is a pixel electrode to be supplied with a data signal corresponding to a gray scale of a pixel including the second transparent conductive layer.

3. The display device according to claim 2, further comprising:
    a fourth transparent conductive layer in a region different from that of at least the second transparent conductive layer as seen in a plan view, the fourth transparent conductive layer being supplied with a voltage different from that of the second transparent conductive layer; and
    a second insulating layer between the second transparent conductive layer and the fourth transparent conductive layer.

4. The display device according to claim 2, further comprising a third transparent conductive layer forming the same layer with the first transparent conductive layer and the second transparent conductive layer, the third transparent conductive layer facing the second transparent conductive layer as seen in a plan view and being supplied with a voltage different from that of the second transparent conductive layer.

5. The display device according to claim 3, further comprising:
    a gate line to be supplied with a gate voltage controlling a transistor including a channel formed of the oxide semiconductor layer to be on or off; and
    a data line to be supplied with the data signal;
    wherein:
    the gate line is connected with the gate electrode;
    the data line is connected with the first electrode; and
    the transistor is located in a crossing area of the gate line and the data line.

6. The display device according to claim 5, wherein the first side wall has a tapered inclining surface tending to open upward.

7. The display device according to claim 4, further comprising:
    a gate line to be supplied with a gate voltage controlling a transistor including a channel formed of the oxide semiconductor layer to be on or off; and
    a data line to be supplied with the data signal;
    wherein:
    the gate line is connected with the gate electrode;
    the data line is connected with the first electrode; and
    the transistor is located in a crossing area of the gate line and the data line.

8. The display device according to claim 7, wherein the first side wall has a tapered inclining surface tending to open upward.

* * * * *